United States Patent
Ha et al.

(10) Patent No.: US 10,600,789 B2
(45) Date of Patent: Mar. 24, 2020

(54) MICRO-PATTERN FORMING METHOD, CAPACITOR AND METHOD OF MANUFACTURING THE SAME, SEMICONDUCTOR DEVICE AND METHOD OF MANUFACTURING THE SAME, AND ELECTRONIC SYSTEM INCLUDING SEMICONDUCTOR DEVICE

(71) Applicant: Samsung Electronics Co., Ltd., Suwon-si, Gyeonggi-do (KR)

(72) Inventors: Soon-mok Ha, Hwaseong-si (KR); Jae-hee Kim, Yongin-si (KR); Chan Hwang, Seoul (KR); Jong-hyuk Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/233,715

(22) Filed: Dec. 27, 2018

(65) Prior Publication Data
US 2019/0157276 A1    May 23, 2019

Related U.S. Application Data

(63) Continuation of application No. 15/826,944, filed on Nov. 30, 2017, now Pat. No. 10,204,912.

(30) Foreign Application Priority Data

Dec. 19, 2016    (KR) .................. 10-2016-0173622

(51) Int. Cl.
*H01L 27/108*    (2006.01)
*H01L 21/311*    (2006.01)
(Continued)

(52) U.S. Cl.
CPC .... *H01L 27/10855* (2013.01); *H01L 21/0273* (2013.01); *H01L 21/31144* (2013.01);
(Continued)

(58) Field of Classification Search
CPC ............... H01L 27/10855; H01L 28/91; H01L 27/10817; H01L 21/0273; H01L 21/31144; H01L 28/87; H01L 21/31127
See application file for complete search history.

(56) References Cited

U.S. PATENT DOCUMENTS 7,053,435 B2    5/2006    Yeo et al.
7,655,968 B2    2/2010    Manning
(Continued)

FOREIGN PATENT DOCUMENTS

KR    100869342 B1    11/2008
KR    20090068774 A    6/2009
(Continued)

*Primary Examiner* — Karen Kusumakar
(74) *Attorney, Agent, or Firm* — Harness, Dickey & Pierce, P.L.C.

(57) ABSTRACT

A method of forming a micro-pattern including forming a mold layer and a supporting material layer on a substrate, patterning the mold layer and the supporting material layer to form recess patterns, forming conductor patterns in the recess patterns, removing a portion of an upper portion of the supporting material layer for causing upper portions of the conductor patterns to protrude, forming a block copolymer layer on the supporting material layer, processing the block copolymer layer to phase-separate the block copolymer layer into a plurality of block parts, selectively removing some of the phase-separated plurality of block parts, and removing the supporting material layer to expose the mold layer at a position corresponding to each of the removed block parts may be provided.

20 Claims, 31 Drawing Sheets

(51) Int. Cl.
*H01L 21/027* (2006.01)
*H01L 49/02* (2006.01)

(52) U.S. Cl.
CPC ........ *H01L 27/10817* (2013.01); *H01L 28/91* (2013.01); *H01L 21/31127* (2013.01); *H01L 28/87* (2013.01)

(56) References Cited

U.S. PATENT DOCUMENTS

| | | |
|---|---|---|
| 8,207,563 B2 | 6/2012 | Basceri et al. |
| 8,970,039 B2 * | 3/2015 | Kuh ................. H01L 23/49827 257/758 |
| 9,099,399 B2 * | 8/2015 | Park ................... H01L 21/0337 |
| 9,240,442 B2 | 1/2016 | Lim et al. |
| 9,299,710 B2 | 3/2016 | Tsui et al. |
| 9,385,129 B2 | 7/2016 | Kang |
| 2013/0309457 A1 | 11/2013 | Rathsack et al. |
| 2014/0272723 A1 | 9/2014 | Somervell et al. |
| 2015/0348963 A1 | 12/2015 | Hung et al. |

FOREIGN PATENT DOCUMENTS

| | | |
|---|---|---|
| KR | 20090068776 A | 6/2009 |
| KR | 20130041522 A | 4/2013 |

\* cited by examiner

MICRO-PATTERN FORMING METHOD, CAPACITOR AND METHOD OF MANUFACTURING THE SAME, SEMICONDUCTOR DEVICE AND METHOD OF MANUFACTURING THE SAME, AND ELECTRONIC SYSTEM INCLUDING SEMICONDUCTOR DEVICE

CROSS-REFERENCE TO RELATED APPLICATION

This application is a continuation of U.S. application Ser. No. 15/826,944, filed Nov. 30, 2017, which claims priority to Korean Patent Application No. 10-2016-0173622, filed on Dec. 19, 2016, in the Korean Intellectual Property Office, the disclosure of each of which is incorporated herein in its entirety by reference.

BACKGROUND

1. Field

Some example embodiments of the inventive concepts relate to micro-pattern forming methods, capacitors and/or methods of manufacturing the same, semiconductor devices and/or methods of manufacturing the same, and/or electronic systems including the semiconductor device, and more particularly, to micro-pattern forming methods for obtaining a precise micro-pattern through a relatively simple process at low cost, capacitors and/or methods of manufacturing the same, semiconductor devices and/or methods of manufacturing the same, and/or electronic systems including the semiconductor device.

2. Description of the Related Art

With the advance of semiconductor technology, micronizing or miniaturizing of patterns for higher integration is being constantly needed. In order to integrate more devices in a limited area, a size of an individual device should be formed as small as possible. Due to a resolution limitation of a photolithography process, however, it is difficult to form a micro-pattern, and expensive equipment is desired for implementing a smaller micro-pattern through the photolithography process. Double patterning technology has been proposed as a method of implementing a micro-pattern without performing the photolithography process. However, in the double patterning technology, a process is complicated, and takes longer time in manufacturing. Therefore, developing a method of forming a micro-pattern through a simpler process at a relatively low cost without performing additional photolithography process is desired.

SUMMARY

Some example embodiments of the inventive concepts provide micro-patterns forming method for obtaining a precise micro-pattern through a relatively simple process at a relatively low cost.

Some example embodiments of the inventive concepts provide capacitor manufacturing methods using the micro-pattern forming method.

Some example embodiments of the inventive concepts provide semiconductor device manufacturing methods using the micro-pattern forming method.

Some example embodiments of the inventive concepts provide capacitors manufactured by applying the micro-pattern forming method.

Some example embodiments of the inventive concepts provide semiconductor devices manufactured by applying the micro-pattern forming method.

Some example embodiments of the inventive concepts provide electronic systems including the semiconductor device.

According to some example embodiments of the inventive concepts, a method of forming a micro-pattern may include forming a mold layer and a supporting material layer on a substrate, patterning the mold layer and the supporting material layer to form a plurality of recess pattern, forming a plurality of conductor patterns in the plurality of recess patterns, removing an upper portion of the supporting material layer so that upper portions of the conductor patterns protrude above the supporting material layer, forming a block copolymer layer on the supporting material layer, processing the block copolymer layer to phase-separate the block copolymer layer into a plurality of block parts, selectively removing some of the block parts, and removing a portion of the supporting material layer to expose the mold layer at a position corresponding to each of the some of the plurality of removed block parts.

According to some example embodiments of the inventive concepts, a method of manufacturing a capacitor may include forming a mold layer and a supporting material layer on a semiconductor substrate, patterning the mold layer and the supporting material layer to form a plurality of recess patterns exposing an upper surface of the semiconductor substrate, forming a plurality of bottom electrodes in the recess patterns, removing an upper portion of the supporting material layer so that an upper portion of each of the plurality of bottom electrodes protrudes above the supporting material layer, forming a block copolymer layer on the supporting material layer, processing the block copolymer layer to phase-separate the block copolymer layer into a plurality of block parts, selectively removing some of the plurality of block parts, removing a portion of the supporting material layer to expose the mold layer at a position corresponding to each of the some of the plurality of block parts, removing the mold layer through the portion from which the supporting material layer has been removed, forming a dielectric layer on a surface of each of the plurality of bottom electrodes, and forming a top electrode on the dielectric layer.

According to some example embodiments of the inventive concepts, a method of manufacturing a semiconductor device may include forming a transistor on a semiconductor substrate, the transistor including a gate structure and an impurity region, forming an interlayer insulation layer on the semiconductor substrate, the interlayer insulation layer covering the transistor and including a contact plug electrically connected to the impurity region, forming a mold layer and a supporting material layer on the interlayer insulation layer, patterning the mold layer and the supporting material layer to form a plurality of recess patterns, forming a plurality of bottom electrodes in the plurality of recess pattern, removing an upper portion of the supporting material layer so that an upper portion of each of the plurality of bottom electrodes protrudes above the supporting material layer, forming a block copolymer layer on the supporting material layer, processing the block copolymer layer to phase-separate the block copolymer layer into a plurality of block parts, selectively removing some of the plurality of block parts, removing a portion of the supporting material layer to expose the mold layer at a position corresponding to each of the some of the plurality of block parts, removing the mold layer through the portion from which the supporting material layer has been removed, forming a dielectric layer on a surface of each of the plurality of bottom electrodes, and forming a top electrode on the dielectric layer.

According to other example embodiments of the inventive concepts, a capacitor may include a plurality of bottom electrodes passing through a supporting layer and having an aspect ratio of about 10 to about 40, a dielectric layer covering a surface of each of the plurality of bottom electrodes, and a top electrode on the dielectric layer, wherein the plurality of bottom electrodes are at positions of vertexes of continuous equilateral triangles, and the supporting layer includes a through-hole provided at a position corresponding to a centroid of a corresponding equilateral triangle.

According to some example embodiments of the inventive concepts, a semiconductor device may include a transistor on a semiconductor substrate and including a gate structure and an impurity region, a first interlayer insulation layer covering the transistor and including a contact plug electrically connected to the impurity region, and a capacitor on the first interlayer insulation layer and electrically connected to the contact plug, wherein the capacitor includes a plurality of bottom electrodes passing through a supporting layer and having an aspect ratio of 10 to 40, and arranged at vertexes of continuous equilateral triangles, a dielectric layer covering a surface of each of the plurality of bottom electrodes, and a top electrode on the dielectric layer, and the supporting layer includes a through-hole at a position corresponding to a centroid of an equilateral triangle formed by three closest bottom electrodes.

According to some example embodiments of the inventive concepts, an electronic system may include a controller, an input/output unit configured to input or output data, a memory configured to store data, an interface configured to transmit data to an external device, and a bus configured to connect the controller, the input/output unit, the memory, and the interface to communicate with each other, wherein at least one of the controller and the memory includes the aforementioned semiconductor device.

According to some example embodiments of the inventive concepts, a method of forming a micro-pattern may include forming an insulation layer and a mask material layer on a substrate, patterning the insulation layer and the mask material layer to form a plurality of recess patterns, forming a plurality of conductor patterns in the plurality of recess patterns such that upper portions of the plurality of conductor patterns protrude above the insulation layer, forming a block copolymer layer on the mask material layer, processing the block copolymer layer to phase-separate the block copolymer layer into a plurality of first block parts and a plurality of second block parts, one of the plurality of second block parts being between two neighboring ones of the plurality of first block parts, selectively removing the plurality of second block parts to expose the mask material layer, and producing the micro-pattern by etching exposed portions of the exposed mask material layer using the block copolymer layer, from which the plurality of second block parts are selectively removed, as an etching mask.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
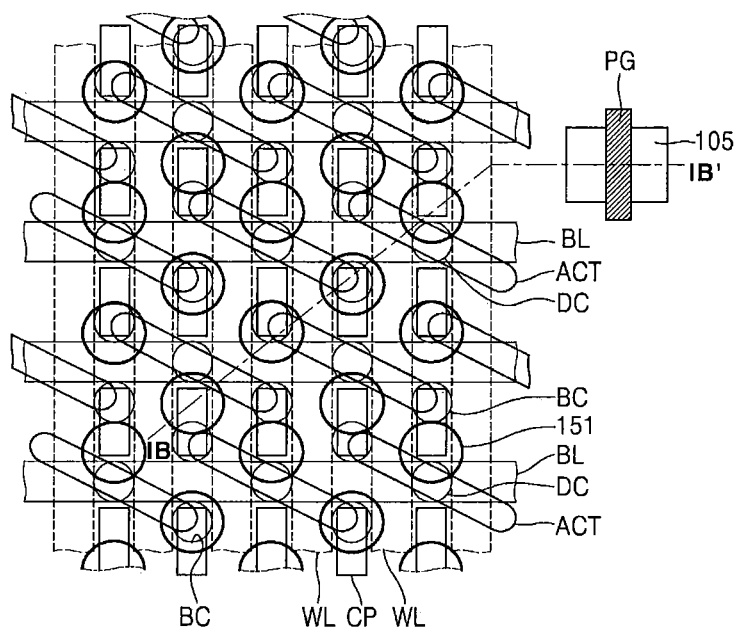
FIG. 1A is a plan view illustrating a layout of a semiconductor device according to an example embodiment of the inventive concepts.
Figure 1B:
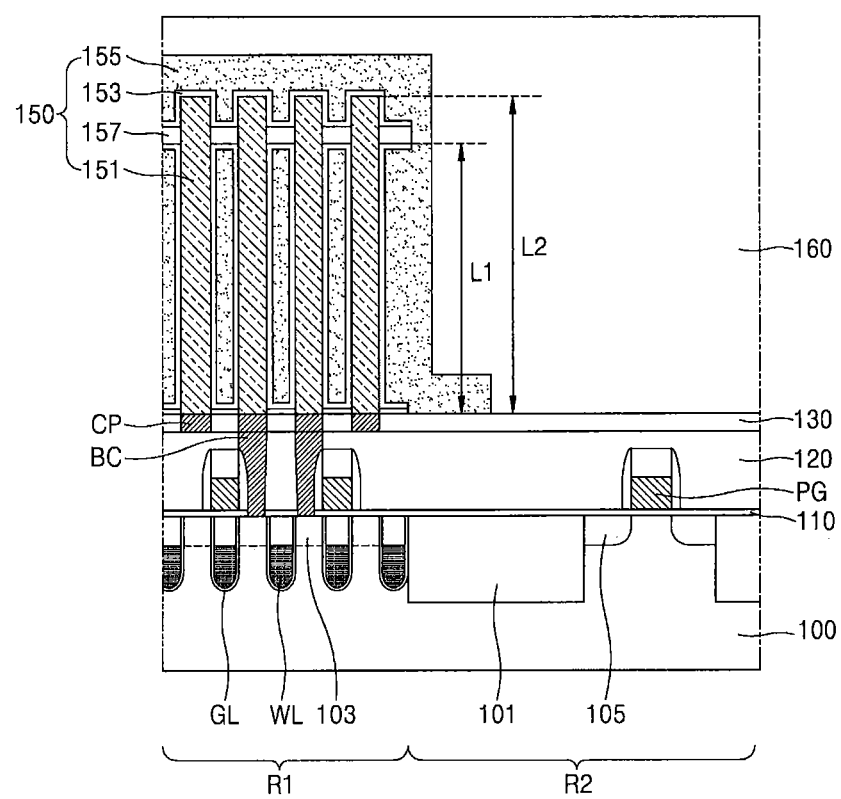
FIG. 1B is a side cross-sectional view taken along line IB-IB' of FIG. 1A.

FIG. 1A is a plan view illustrating a layout of a semiconductor device 1 according to an example embodiment. FIG. 1B is a side cross-sectional view taken along line IB-IB' of FIG. 1A.

Referring to FIGS. 1A and 1B, a semiconductor substrate 100 may include a first region R1 and a second region R2. The first region R1 may be a cell region, and the second region R2 may be a peripheral circuit region.

According to some example embodiments, a memory cell array including a plurality of memory cells may be disposed on the semiconductor substrate 100 in the first region R1. The memory cell array may include the plurality of memory cells and a plurality of word lines WL and bit lines BL which are electrically connected to the memory cells. In some example embodiments, the memory cells may each include a capacitor 150 which includes a bottom electrode 151, a top electrode 155, and a dielectric layer 153 therebetween. Furthermore, a supporting layer 157 may horizontally connect the bottom electrodes 151 of the memory cells to each other to reduce or prevent the bottom electrodes 151 from falling down.

A peripheral circuit, which includes, for example, a row decoder, a column decoder, a page buffer, and/or an input/output (I/O) circuit, may be disposed on the semiconductor substrate 100 in the second region R2. In some example embodiments, the peripheral circuit may include a plurality of CMOS transistors, a resistor, and/or a plurality of capacitors which are electrically connected to the memory cell array.

For example, an isolation layer 101 that defines a plurality of active regions may be formed on the semiconductor substrate 100 in the first region R1. The active regions ACT may have a bar shape, and a long axis of each of the active regions ACT may be disposed in a diagonal direction with respect to the word lines WL and the bit lines BL.

The word lines WL may be disposed across the active regions ACT. In some example embodiments, the word lines WL may be formed by providing a gate insulation layer in a recess region which is recessed by a certain depth from a surface of each of the active regions ACT. Also, a top of each of the word lines WL may be located on a level which is lower than a top of the semiconductor substrate 100, and an insulating material may be filled into a recess region where each of the word lines WL is formed.

A plurality of impurity regions 103, such as a source region and a drain region, may be provided in the active regions ACT next to both sides of each of the word lines WL. The impurity regions 103 may configure a plurality of MOS transistors with the word lines WL.

The bit lines BL may be disposed across the word lines WL on the semiconductor substrate 100 in the first region R1. A first interlayer insulation layer 110 may be disposed between the bit lines BL and the semiconductor substrate 100. A plurality of bit line contact plugs DC, which electrically connect the impurity regions 103 to the bit lines BL, may be formed on the first interlayer insulation layer 110.

The first interlayer insulation layer 110 may include high density plasma (HDP) oxide, tetraethyl ortho silicate (TEOS), plasma enhanced TEOS (PE-TEOS), $O_3$-TEOS, undoped silicate glass (USG), phospho silicate glass (PSG), borosilicate glass (BSG), borophosphosilicate glass (BPSG), fluoride silicate glass (FSG), spin on glass (SOG), tonen silazene (TOSZ), or a combination thereof. In some example embodiments, the first interlayer insulation layer 110 may include silicon nitride, silicon oxynitride, or a low-k material having a relatively low dielectric constant.

Moreover, the isolation layer 101 may define a peripheral active region on the semiconductor substrate 100 in the second region R2. A peripheral gate electrode PG may be disposed across the peripheral active region, and peripheral source and drain regions 105 may be provided in peripheral active regions next to both sides of the peripheral gate electrode PG.

A second interlayer insulation layer 120 may cover the bit lines BL in the first region R1 and may cover the peripheral gate electrode PG in the second region R2. The second interlayer insulation layer 120 may include HDP oxide, TEOS, PE-TEOS, $O_3$-TEOS, USG, PSG, BSG, BPSG, FSG, SOG, TOSZ, or a combination thereof. In some example embodiments, the second interlayer insulation layer 120 may include silicon nitride, silicon oxynitride, or a low-k material having a low dielectric constant.

A plurality of contact plugs BC, which electrically connect a data storing element (i.e., a capacitor 150) to the impurity regions 103, may be formed in the second interlayer insulation layer 120 in the first region R1. In some example embodiments, the contact plugs BC may be disposed in the active regions ACT next to both sides of each of the bit lines BL. Furthermore, the contact plugs BC may be arranged in a continuous equilateral triangle form, a honeycomb form, or a zigzag form from a planar perspective.

Moreover, a plurality of contact holes which expose the impurity regions 103 may be formed in the second interlayer insulation layer 120, a conductive layer which buries the contact holes may be deposited, and the conductive layer may be planarized and node-separated, thereby forming the contact plugs BC. The contact plugs BC may each include one of impurity-doped polysilicon, metal, conductive metal nitride, and metal silicide or a combination thereof.

In some example embodiments, a plurality of contact pads CP may be respectively formed on the contact plugs BC. The contact pads CP may be two-dimensionally arranged on the second interlayer insulation layer 120 in the first region R1. The contact pads CP may increase a contact area between the contact plugs BC and the bottom electrode 151 of the capacitor 150 formed thereon. In the contact pads CP, two contact pads CP which are adjacent to each other with the bit line BL therebetween may extend in opposite directions.

A third interlayer insulation layer 130 may be formed between the contact pads CP. The third interlayer insulation layer 130 may include HDP oxide, TEOS, PE-TEOS, $O_3$-TEOS, USG, PSG, BSG, BPSG, FSG, SOG, TOSZ, or a combination thereof. In some example embodiments, the third interlayer insulation layer 130 may include silicon nitride, silicon oxynitride, or a low-k material having a low dielectric constant.

The bottom electrode 151 of the capacitor 150 may be formed on each of the contact pads CP. In some example embodiments, the contact plugs BC may be arranged in a continuous equilateral triangle form, a honeycomb form, or a zigzag form from a planar perspective. A detailed layout of the bottom electrode 151 will be described in detail with reference to FIG. 2.

The bottom electrode 151 may be supported by the supporting layer 157. The bottom electrode 151 may have a relatively high aspect ratio of about 10 to about 40. Thus, if the supporting layer 157 is not provided, the bottom electrode 151 can be inclined and/or broken, or can contact another bottom electrode 151. Therefore, in order to reduce or prevent such a problem, the supporting layer 157 may be provided, thereby reducing or preventing the bottom electrode 151 from being inclined and/or broken.

A distance L1 between a lower surface of the supporting layer 157 and a lower end of the bottom electrode 151 may be about 20% to about 99% of a total height L2 of the bottom electrode 151. In some example embodiments, the distance L1 between the lower surface of the supporting layer 157 and the lower end of the bottom electrode 151 may be about 50% to about 85% of the total height L2 of the bottom electrode 151. In FIG. 1B, an example where the supporting layer 157 is formed of only one layer is illustrated, but a plurality of supporting layers may be provided to have different distances without being limited thereto.

The dielectric layer 153 may be conformally formed on a surface of each of the bottom electrodes 151, and the top electrode 155 may be formed on the dielectric layer 153. The capacitor 150 may be formed in the first region R1, and then, a fourth interlayer insulation layer 160 covering the first region R1 and the second region R2 may be formed.

Figure 2:
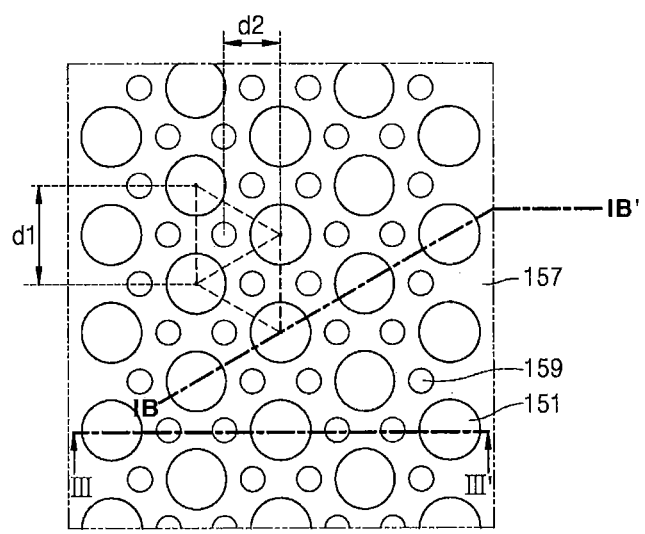
FIG. 2 is a plan view illustrating a conceptual layout of a supporting layer and a bottom electrode.

FIG. 2 is a plan view illustrating a conceptual layout of a supporting layer 157 and a bottom electrode 151.

Referring to FIG. 2, the bottom electrode 151 may be provided to pass through the supporting layer 157. FIG. 2 simply illustrates a relative position of a plurality of the bottom electrode 151 and is not intended to illustrate a detailed shape thereof. Therefore, shapes of the bottom electrode 151 according to example embodiments are not limited to the shape shown in FIG. 2.

The bottom electrode 151 may be provided at positions of vertexes of continuous equilateral triangles. For example, an equilateral triangle may be formed by connecting centers of the three bottom electrodes 151 which are closest to each other among a plurality of the bottom electrodes 151. In some example embodiments, in three bottom electrodes 151 closest to each other among the plurality of bottom electrodes 151, a right-angled triangle (e.g., a right-angled isosceles triangle) may be formed by connecting centers of the three bottom electrodes 151.

A distance d1 between two closest ones of the bottom electrodes 151 (e.g., between adjacent two of the bottom electrodes 151) may be about 20 nm to about 60 nm. However, example embodiments are not limited thereto, and the distance d1 may be less than 20 nm. A horizontal cross-sectional shape of the bottom electrode 151 may be substantially circular or elliptical. If the horizontal cross-sectional shape of the bottom electrode 151 is elliptical, a position of a center may be defined as an intersection point of a longest axis and a shortest axis. If the horizontal cross-sectional shape of the bottom electrode 151 is not circular or elliptical, and for example, is polygonal, a center may be defined as a centroid of a corresponding cross-sectional shape.

In some example embodiments, a through-hole 159 which passes through the supporting layer 157 may be disposed in a centroid of an equilateral triangle formed by three closest ones of the bottom electrodes 151. For example, a center of the through-hole 159 may be disposed in the centroid.

A distance d2 between the center of the through-hole 159 and a center of the bottom electrode 151 closest thereto may be about 10 nm to about 50 nm. In some example embodiments, the distance d1 may be about 12 nm to about 32 nm.

The through-hole 159 may be provided in plurality, and the plurality of through-holes 159 may be arranged in a honeycomb form. That is, six closest ones of the through-holes 159 may be respectively disposed in vertexes of a regular hexagon. In other words, centers of six closest ones of the through-holes 159 may form a regular hexagon.

A horizontal cross-section of each of the through-holes 159 may have a circular shape and a diameter of each of the through-holes 159 may be about 1 nm to about 30 nm. However, example embodiments are not limited thereto. For example, the horizontal cross-sectional surface of each of the through-holes 159 may have an elliptical shape.

Referring back to FIG. 1B, an aspect ratio of the bottom electrode 151 may be about 10 to about 40. The aspect ratio may be defined as a value obtained by dividing a height of the bottom electrode 151 by a shortest dimension of the bottom electrode 151 in a widthwise direction. For example, a width of the bottom electrode 151 in the widthwise direction may have a value between about 7 nm and about 100 nm. For example, the height of the bottom electrode 151 may have a value of about 200 nm to about 4000 nm.

In FIG. 1B, it is illustrated that the width of the bottom electrode 151 is constant irrespective of the height of the bottom electrode 151, but example embodiments are not limited thereto. In other example embodiments, the width of the bottom electrode 151 may vary along the height. For example, the width of the bottom electrode 151 may decrease progressively closer to the semiconductor substrate 100.

As described above, it may be difficult for the bottom electrode 151 having a high aspect ratio to vertically stand alone. Thus, a defect may occur when the bottom electrode 151 falls down and contacts another bottom electrode 151 adjacent thereto. Accordingly, the supporting layer 157 may be provided so that the plurality of bottom electrodes 151 are spaced apart from each other and stand vertically.

The supporting layer 157 may be provided to surround the bottom electrode 151. For example, an entire circumference of the bottom electrode 151 may contact the supporting layer 157 at a certain height.

As described above, the plurality of through-holes 159 may be provided in the supporting layer 157, and in this case, the bottom electrodes 151 may not contact the through-holes 159. In some example embodiments, the supporting layer 157 may have a through-hole 159 fluidly connected to the bottom electrode 151. Thus, the bottom electrode 151 partially limits a circumferential portion of the through-hole 159.

For example, if one through-hole 159 is fluidly connected to the bottom electrode 151, a slight difference occurs between a bottom electrode 151 fluidly connected by the one through-hole 159 and another bottom electrode 151 not fluidly connected by another through-hole 159, and as a process proceeds progressively, this slight difference may cause an unintended non-uniformity.

The supporting layer 157 may include, for example, silicon nitride (SiNx), silicon carbonitride (SiCN), tantalum oxide (TaOx), titanium oxide (TiOx), or a combination thereof. However, the supporting layer 157 according to example embodiments is not limited to these materials.

The supporting layer 157 may have, for example, a thickness of about 10 nm to about 500 nm.

Figure 3A:
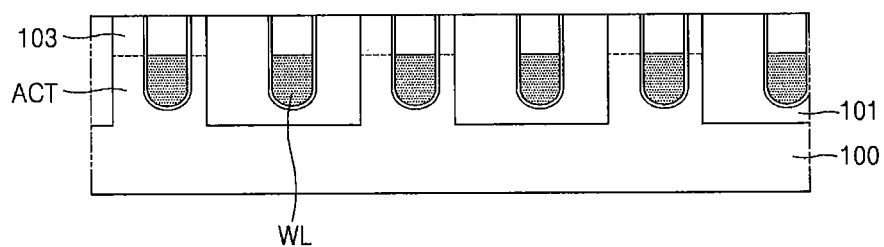
FIGS. 3A to 3O are cross-sectional views sequentially illustrating a method of manufacturing a semiconductor device, according to an example embodiment of the inventive concepts.

FIGS. 3A to 3O are cross-sectional views sequentially illustrating a method of manufacturing a semiconductor device, according to an example embodiment. FIG. 4 is a plan view illustrating a layout in a process of FIG. 3I. The cross-sectional views of FIGS. 3A to 3O show a cross-sectional surface taken along line III-III' of FIG. 2, and thus, may have a form different from the cross-sectional surface illustrated in FIG. 1B.

Referring to FIG. 3A, an isolation layer 101 may be formed on a semiconductor substrate 100 to define a plurality of active regions ACT.

The semiconductor substrate 100 may include a semiconductor (e.g., silicon (Si) or germanium (Ge)). In other example embodiments, the semiconductor substrate 100 may include a compound semiconductor (e.g., SiGe, SiC, GaAs, InAs, or InP). In other example embodiments, the semiconductor substrate 100 may have a silicon on insulator (SOI) structure. The semiconductor substrate 100 may include a conductive region, for example, an impurity-doped well or an impurity-doped structure.

The isolation layer 101 may include, for example, silicon oxide, silicon nitride, silicon oxynitride, or a combination thereof.

A recess which extends across the active region ACT may be formed, a gate insulation layer and a word line WL may be formed, and a capping layer including an insulating material may be formed on the word line WL. Also, an impurity region 103 may be formed by injecting impurities into the active regions ACT next to both sides of the word line WL. The impurity region 103 may act as a source region or a drain region. The word line WL, the source region, and the drain region may configure one transistor element.

Figure 3B:
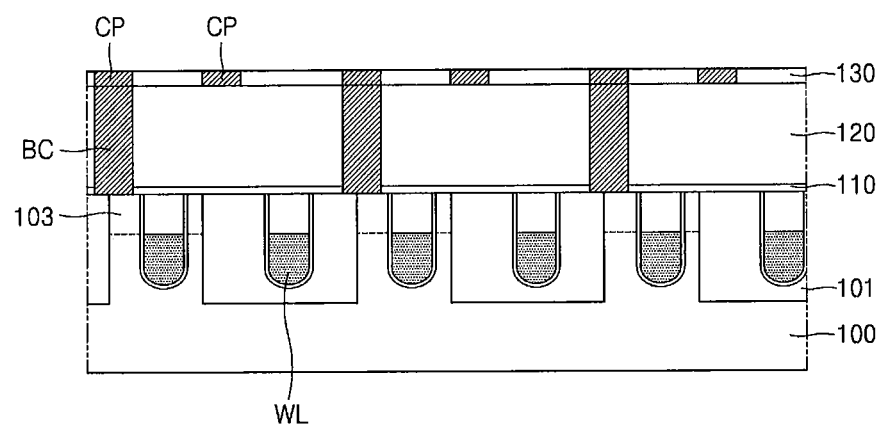

Referring to FIG. 3B, a first interlayer insulation layer 110 may be formed to cover all of the active regions ACT. A bit line contact plug DC, which is to be electrically connected to a bit line BL (see FIG. 1A) later, may be provided in the first interlayer insulation layer 110. The first interlayer insulation layer 110 may include silicon oxide.

A bit line may be formed so as to be electrically connected to the bit line contact plug DC, and then, a second interlayer insulation layer 120 may be formed to cover the bit line. A plurality of contact plugs BC may be provided in the second interlayer insulation layer 120. The contact plugs BC may be electrically connected to the impurity region 103 through the first interlayer insulation layer 110 and the second interlayer insulation layer 120.

The contact plugs BC and the bit line contact plug DC may each include polysilicon, metal, conductive metal nitride, metal silicide, or a combination thereof, which is independently doped.

Subsequently, a third interlayer insulation layer 130 covering the second interlayer insulation layer 120 may be formed. A plurality of contact pads CP may be provided in the third interlayer insulation layer 130. The contact pads CP may contact the contact plugs BC. In FIG. 3B, contact pads CP which do not contact the contact plugs BC may be contact pads CP electrically connected to the contact plugs BC disposed at positions farther away than an illustrated cross-sectional surface in a diagonal direction.

Figure 3C:
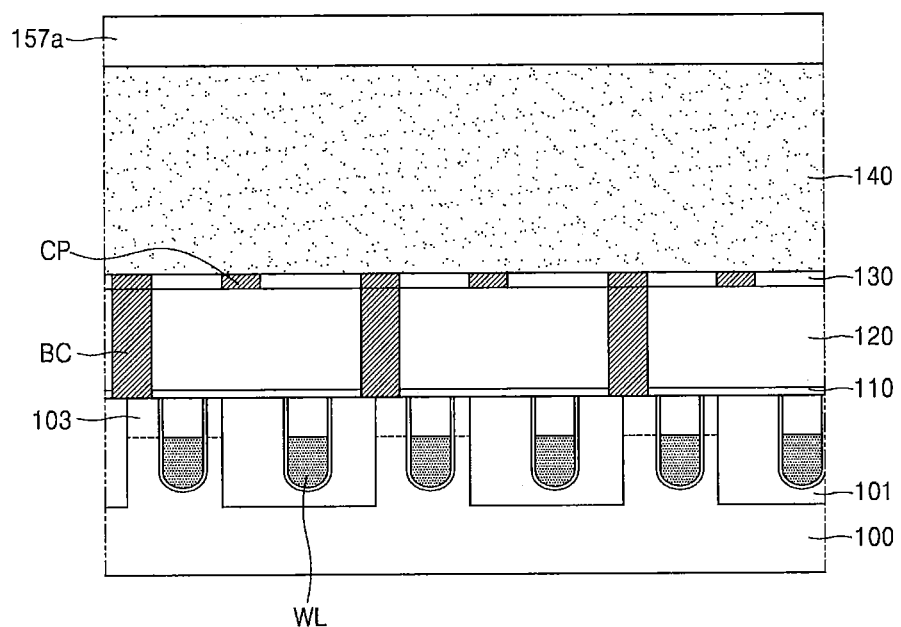

Referring to FIG. 3C, a mold layer 140 and a supporting material layer 157a may be formed on the third interlayer insulation layer 130. The mold layer 140 may include, for example, silicon oxide, and for example, may be formed by a chemical vapor deposition (CVD) process. For example, the mold layer 140 may include BPSG, USG, and/or etc. A thickness of the mold layer 140 may be determined based on a height of a bottom electrode of a capacitor which is to be formed. For example, the thickness of the mold layer 140 may be about 200 nm to about 4,000 nm.

The supporting material layer 157a may include an arbitrary material having a sufficient etch selectivity over the mold layer 140. In a case of performing a lift-off process using an etching atmosphere (for example, an etchant including ammonium fluoride ($NH_4F$), hydrogen fluoride (HF), and water) to remove the mold layer 140 in a subsequent process, the supporting material layer 157a may include a material having a relatively low etching rate with respect to the etchant.

In some example embodiments, the supporting material layer 157a may include silicon nitride, silicon carbonitride, silicon germanium (SiGe), tantalum oxide, titanium oxide, or a combination thereof, but materials of the supporting material layer 157a are not limited thereto.

In some example embodiments, the supporting material layer 157a may have a multi-layer structure. For example, the supporting material layer 157a may have a multi-layer structure where at least two material layers, each including materials selected from among silicon nitride, silicon carbonitride, tantalum oxide, and titanium oxide, are sequentially stacked.

The supporting material layer 157a may have, for example, a thickness of about 100 nm to about 1,000 nm.

Figure 3D:
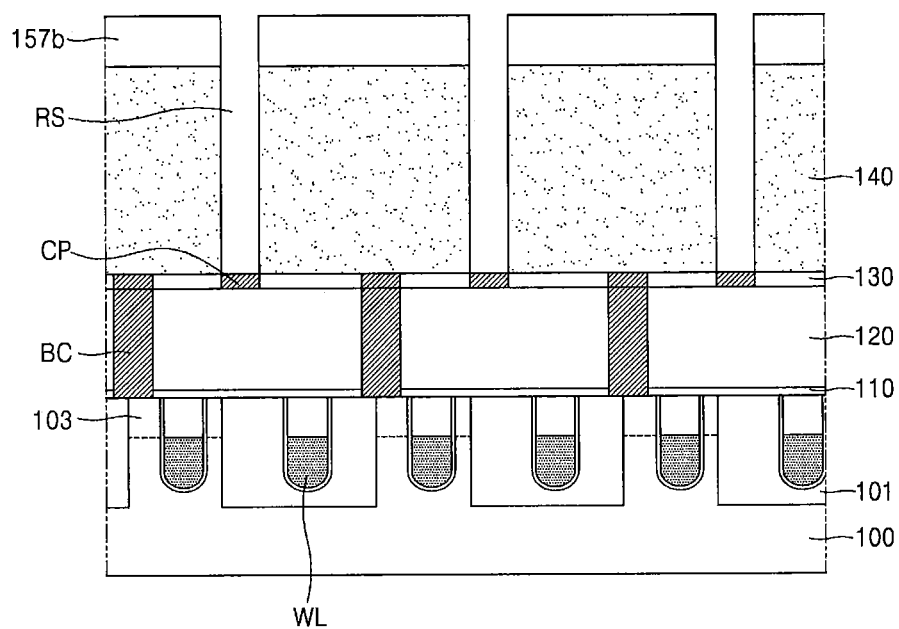

Referring to FIG. 3D, a recess pattern RS may be formed at a position at which a bottom electrode is to be formed. The recess pattern RS may be formed to expose the contact pads CP. If the contact pads CP are not provided, the recess pattern RS may be formed to expose the contact plug BC disposed at a position corresponding to the bottom electrode.

In order to form the recess pattern RS, a sacrificial layer and a mask pattern may be formed on the supporting material layer 157a. The sacrificial layer may be provided for protecting the supporting material layer 157a and may include oxide (e.g., BPSG, phosphor silicate glass (PSG), USG, spin on dielectric (SOD), HDP oxide). The mask pattern may include oxide, nitride, polysilicon, photoresist, or a combination thereof. A region, where the bottom electrode of a capacitor is to be formed, may be defined by the mask pattern.

The recess pattern RS may be formed by an anisotropic etching process. The anisotropic etching process may be performed by, for example, a high density plasma (HDP) etching process, a reactive ion etching process, a sputter etching process, a reactive ion beam etching process, etc. However, example embodiments are not limited to these processes.

A width of the recess pattern RS may be constant along a height, or may increase progressively farther away from the semiconductor substrate 100.

Figure 3E:
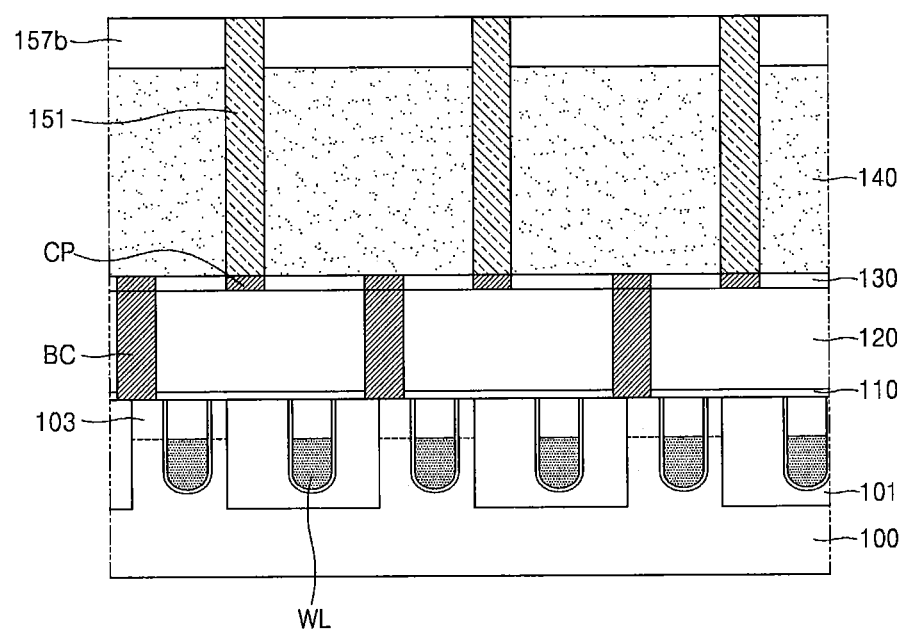

Referring to FIG. 3E, a bottom electrode 151 may be formed in the recess pattern RS. The recess pattern RS may be provided in plurality, and the bottom electrode 151 may be provided in plurality. The bottom electrodes 151 respectively formed in the plurality of recess patterns RS may configure a conductor pattern.

The bottom electrode 151 may be formed to fully or partially fill the inside of the recess pattern RS. The bottom electrode 151 may include cobalt (Co), titanium (Ti), nickel (Ni), tungsten (W), molybdenum (Mo), platinum (Pt), ruthenium (Ru), iridium (Jr), titanium nitride (TiN), tantalum nitride (TaN), titanium aluminium nitride (TiAlN), tantalum aluminium nitride (TaAlN), titanium silicon nitride (TiSiN), tungsten nitride (WN), platinum oxide (PtO), ruthenium oxide (RuOx), iridium oxide (IrOx), SRO($SrRuO_3$), BSRO (($Ba,Sr)RuO_3$), CRO($CaRuO_3$), LSCO($(La,Sr)CoO_3$), or a combination thereof. However, materials of the bottom electrode 151 are not limited to the above-described materials.

The bottom electrode 151 may be formed by, for example, a CVD process, a metal organic CVD (MOCVD) process, or an atomic layer deposition (ALD) process. A material layer forming the bottom electrode 151 may be provided on an upper surface of a supporting material layer pattern 157b between the recess patterns RS, and removed by using an etchback process or a chemical mechanical polishing (CMP) process to leave the material layer in only the inside of the recess pattern RS to form the bottom electrode 151.

Figure 3F:
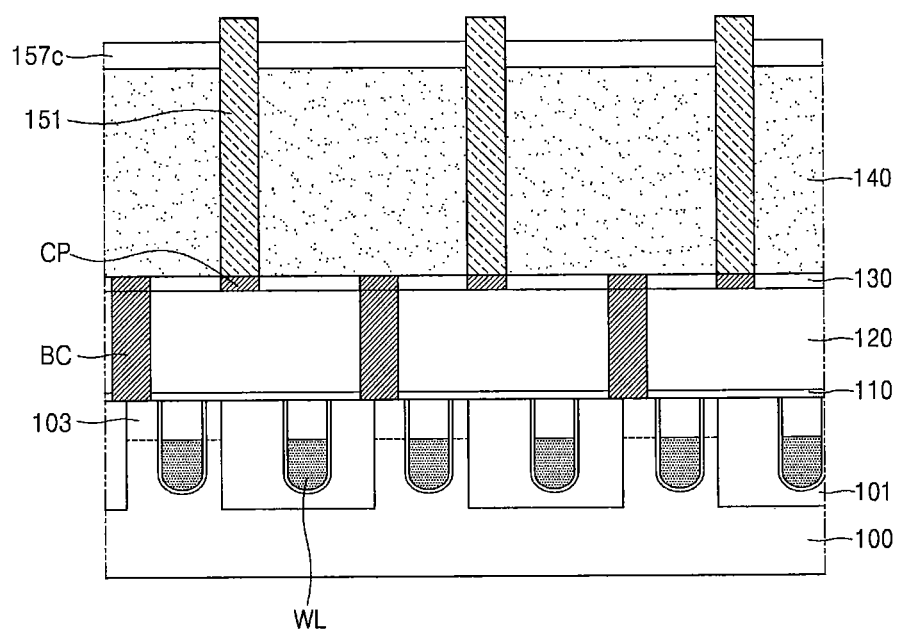

Referring to FIG. 3F, a portion of an upper portion of the supporting material layer pattern 157b may be removed in order for an upper portion of each of the bottom electrodes 151 to protrude.

By removing a portion of the upper portion of the supporting material layer pattern 157b to form a supporting material layer pattern, an upper end of each of the bottom electrodes 151 may protrude from an upper surface of a modified supporting material layer pattern 157c. A protruding height may be about 10 nm to about 300 nm.

In order for the upper end of each of the bottom electrodes 151 to protrude, a portion of the upper portion of the supporting material layer pattern 157b may be removed by using, for example, an etchback process, or a wet etching process. The upper end of each of the bottom electrodes 151 may be made to protrude by providing the supporting material layer pattern 157b to include a material having a sufficient etch selectivity with respect to the bottom electrodes 151.

Figure 3G:
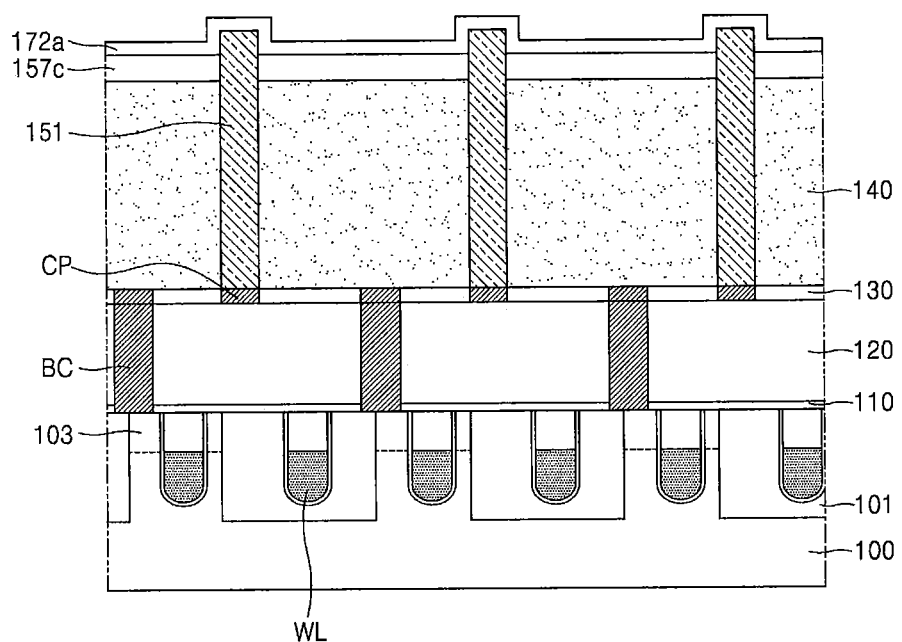

Referring to FIG. 3G, an inorganic mask material layer 172a may be formed on exposed surfaces of the protruding bottom electrodes 151 and the upper surface of the modified supporting material layer pattern 157c. The inorganic mask material layer 172a may be conformally formed on the surfaces.

In some example embodiments, the inorganic mask material layer 172a may be formed by, for example, a CVD process or an ALD process, but example embodiments are not limited thereto.

The inorganic mask material layer 172a may include, for example, silicon oxide, silicon nitride, or silicon oxynitride, and may include an inorganic material having a sufficient etch selectivity with respect to the supporting material layer pattern 157b.

Figure 3H:
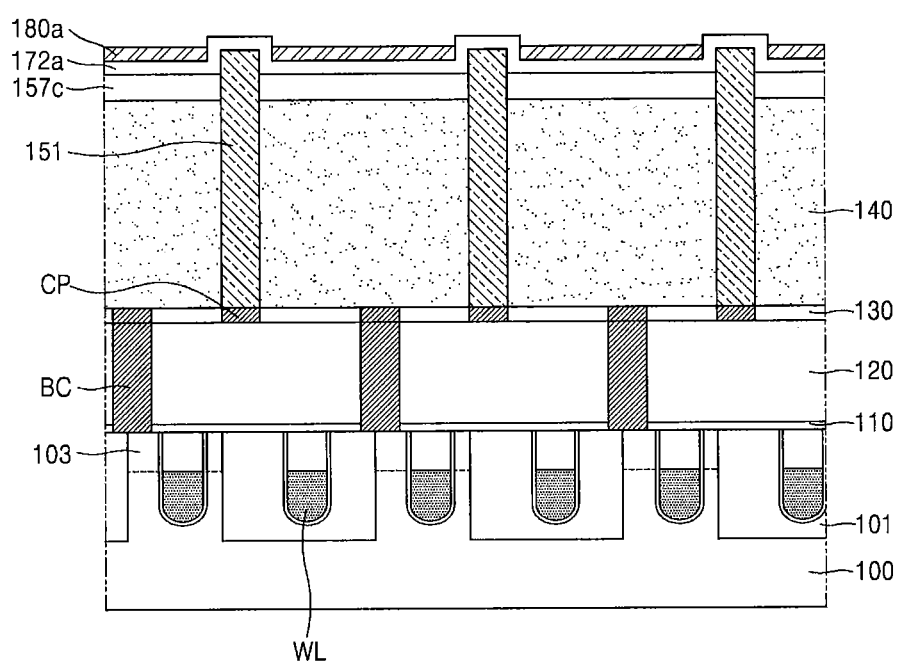

Referring to FIG. 3H, a block copolymer layer 180a may be formed on the inorganic mask material layer 172a.

The block copolymer may be a polymer where two or more polymer blocks are bonded to each other by a covalent bond. The polymer blocks may have different properties. The polymer blocks may include a first polymer block and a second polymer block. That is, one block copolymer molecule may be a polymer molecule which includes the first polymer block and the second polymer block bonded to each other. Before phase separation to be described below, the first polymer block and the second polymer block may be randomly mixed with each other in the block copolymer layer 180a.

One of the first polymer block and the second polymer block may be selected to have hydrophilicity, and the other may be selected to have hydrophobicity. In some example embodiments, one of the first polymer block and the second polymer block may be selected to have a relatively strong polarity, and the other may be selected to have no polarity or a relatively weak polarity.

For example, the block copolymer may be PS(polystyrene)-b-PI(polyimide), PS(polystyrene)-b-PB(polybutene), PS(polystyrene)-b-PMMA(poly(methyl methacrylate)), PEPPEE(poly(ethylenepropylene)-b-poly(ethylethylene)), PE(polyethylene)-b-PEE(poly(ethylethylene)), PS(polystyrene)-b-PDMS (polydimethylsiloxane), PS(polystyrene)-b-PVP(polyvinyl pyrrolidone), or PS(polystyrene)-b-PEO (polyethyleneoxide). Here, polystyrene, poly(ethylenepropylene), and polyethylene may act as the first polymer block, and polyimide, polybutene, poly(methyl methacrylate), poly(ethylethylene), polydimethylsiloxane, polyvinyl pyrrolidone, and polyethyleneoxide may act as the second polymer block. The block copolymer may be manufactured by an anion polymerization process. A method of manufacturing the block copolymer is well known to one of ordinary skill in the art, and thus, its detailed description is omitted.

The block copolymer may be dissolved in a solvent, and then, the block copolymer layer 180a may be formed on the inorganic mask material layer 172a by, for example, a spin coating process. The solvent may be removed through evaporation after coating.

Figure 3I:
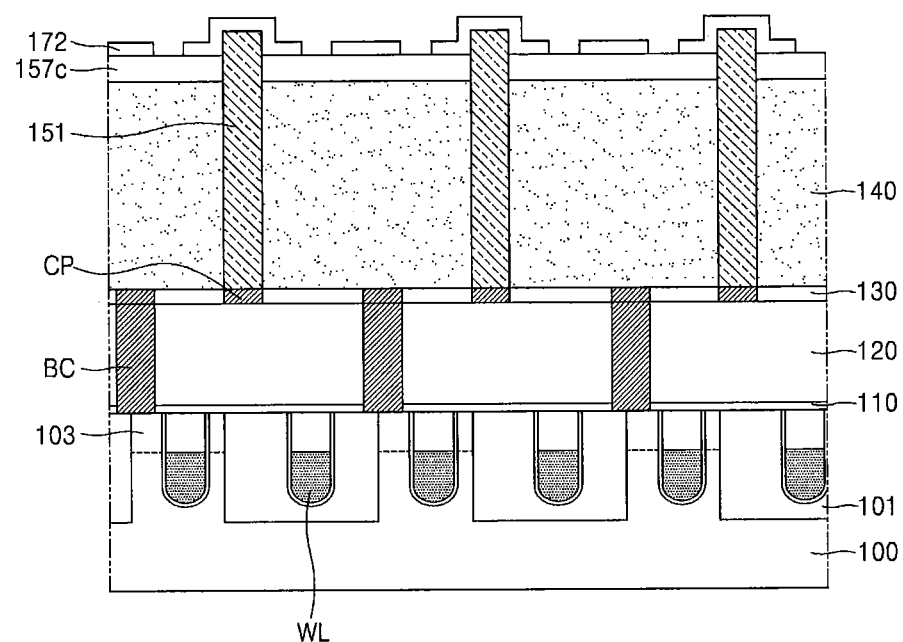
Figure 4:
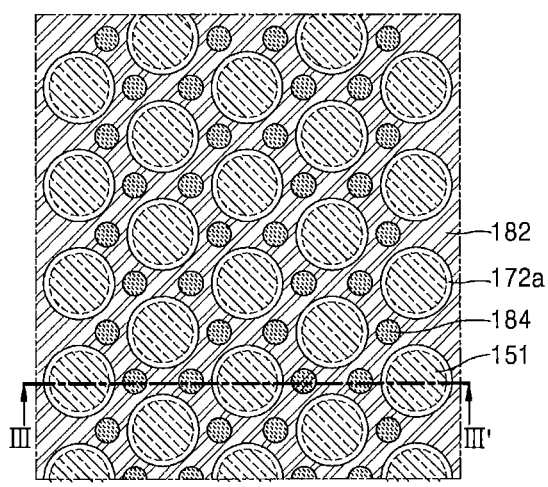
FIG. 4 is a plan view illustrating a layout in a process of FIG. 3I.

Referring to FIGS. 3I and 4, a modified block copolymer layer 180, which includes a first block part 182 including the first polymer block and a second block part 184 including the second polymer block, may be obtained by performing micro-phase separation on the block copolymer layer 180a (see FIG. 3H). The second block part 184 may correspond to a position of a through-hole 159 (see FIG. 2) which is to be formed later.

In order to perform phase separation on the block copolymer layer 180a, the block copolymer layer 180a may be annealed at a temperature which is higher than a glass transition temperature Tg of the block copolymer of the block copolymer layer 180a. For example, in order to perform the phase separation on the block copolymer layer 180a, the block copolymer layer 180a may be annealed for about one hour to about twenty-four hours at a temperature selected from a range of about 130° C. to about 190° C.

When the block copolymer layer 180a is annealed, the polymer blocks of the block copolymer layer 180a may interact with the inorganic mask material layer 172a, thereby forming the first block part 182 and the second block part 184.

The first block part 182 may include a polymer segment having properties different from those of the second block part 184. The first block part 182 may surround the protruding bottom electrode 151. In some example embodiments, the second block part 184 may have a pillar type. The first block part 182 may be formed between the protruding bottom electrode 151 and the second block part 184, which is provided in plurality.

In some example embodiments, the second block part 184 may be located in a centroid of an equilateral triangle formed by three closest ones of the bottom electrodes 151. The second block part 184 may be provided in plurality, and the second block parts 184 may be respectively disposed in vertexes of a regular hexagon, and thus may be arranged in a honeycomb form.

In FIGS. 3A to 3O and 4, an example where the second block part 184 is located in the centroid of the equilateral triangle is illustrated, but a position and a size of the second block part 184 may be controlled to a degree. The position and the size of the second block part 184 may be controlled to a degree by adjusting a ratio of a relative content of the first polymer block to a relative content of the second polymer block in the block copolymer and a number average molecular weight "Mn" (or a weight average molecular weight "Mw") of the block copolymer.

In some example embodiments, the block copolymer layer 180a (see FIG. 3H) may contact only the inorganic mask material layer 172a without contacting other material layers. Therefore, the first block part 182 and the second block part 184 are not substantially affected by an external condition, and thus phase separation may be performed with relative ease. Therefore, phase separation may be performed based on properties included in the block copolymer layer 180a, and thus, a more precise pattern may be formed.

Figure 3J:
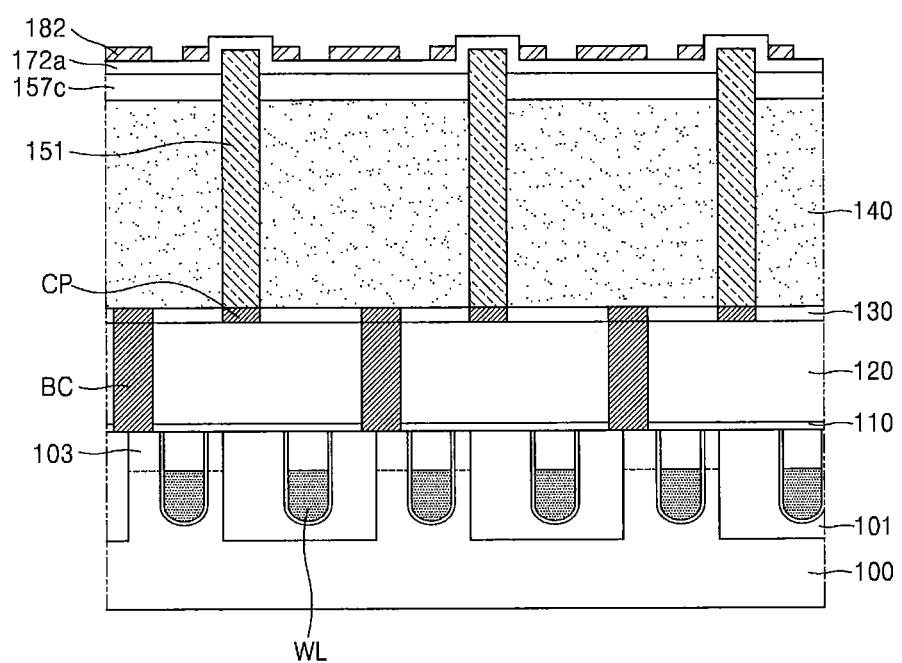

Referring to FIG. 3J, the second block part 184 may be selectively removed. The second block part 184 may be removed by, for example, an etching process. For example, the second block part 184 may be removed by a wet-development process and/or a dry-development process.

For example, in order to selectively remove the second block part 184, the second block part 184 may be selectively decomposed by applying a polymer decomposer to the modified block copolymer layer 180, and then, a process of stripping the decomposed second block part 184 may be performed by using a cleaning solution (for example, isopropyl alcohol (IPA)). In some example embodiments, the polymer decomposer may use radiant ray or plasma.

The radiant ray may be provided in an oxygen atmosphere and may be deep ultraviolet (DUV), soft X-ray, or an E-beam. The plasma may be oxygen plasma. Energy or a kind of the polymer decomposer may be selected for selectively decomposing the second block part 184. For example, threshold energy where the first block part 182 starts decomposition may differ from threshold energy where the second block part 184 starts decomposition. Therefore, the radiant ray or the plasma which has energy for selectively decomposing only the second block part 184 among the first and second block parts 182 and 184 may be applied to the modified block copolymer layer 180. Radiant ray energy or plasma energy may be adjusted based on a radiant ray irradiation duration or a plasma exposure duration.

Figure 3K:
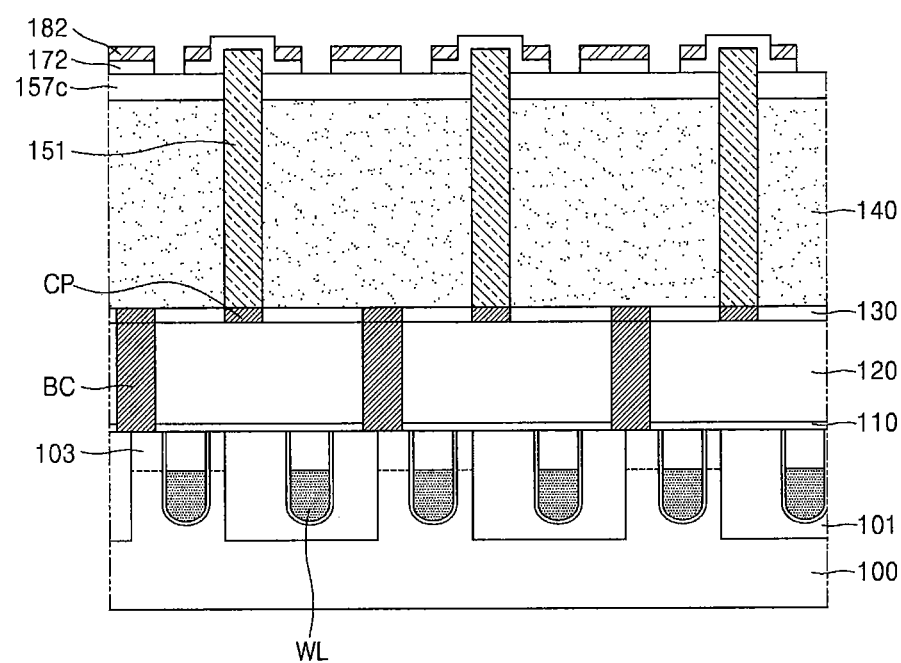

Referring to FIG. 3K, the inorganic mask material layer 172a (see FIG. 3J) may be etched by using the first block part 182 as an etch mask, thereby obtaining an inorganic mask 172. For example, the inorganic mask material layer 172a may be patterned by an anisotropic etching process. The anisotropic etching process may be performed until the modified supporting material layer pattern 157c is exposed.

The anisotropic etching process may be performed by, for example, an HDP etching process, a reactive ion etching process, a sputter etching process, or a reactive ion beam etching process. However, example embodiments are not limited to these processes.

Figure 3L:
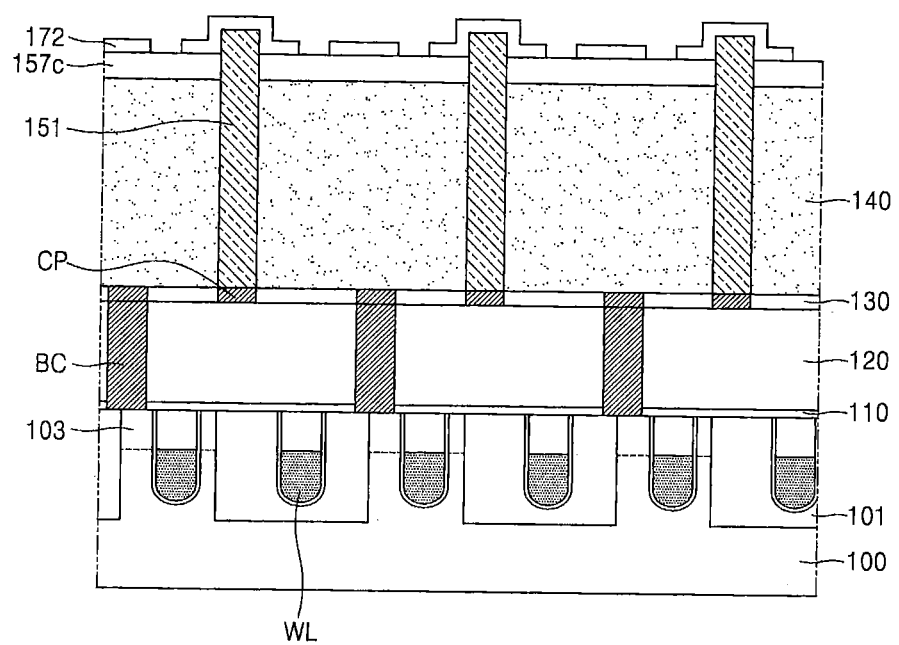

Referring to FIG. 3L, the first block part 182 may be removed. The first block part 182 may be removed through, for example, an ashing process or a wet etching process. The ashing process may be performed at a temperature increased in an oxidation atmosphere. The wet etching process may be performed by using a solvent, and the solvent may include, for example, tetrahydrofuran (THF), triethylamine (TEA), dimethylformamide (DMF), ethylacetate, dimethyl sulfoxide (DMSO), or a compound thereof.

Figure 3M:
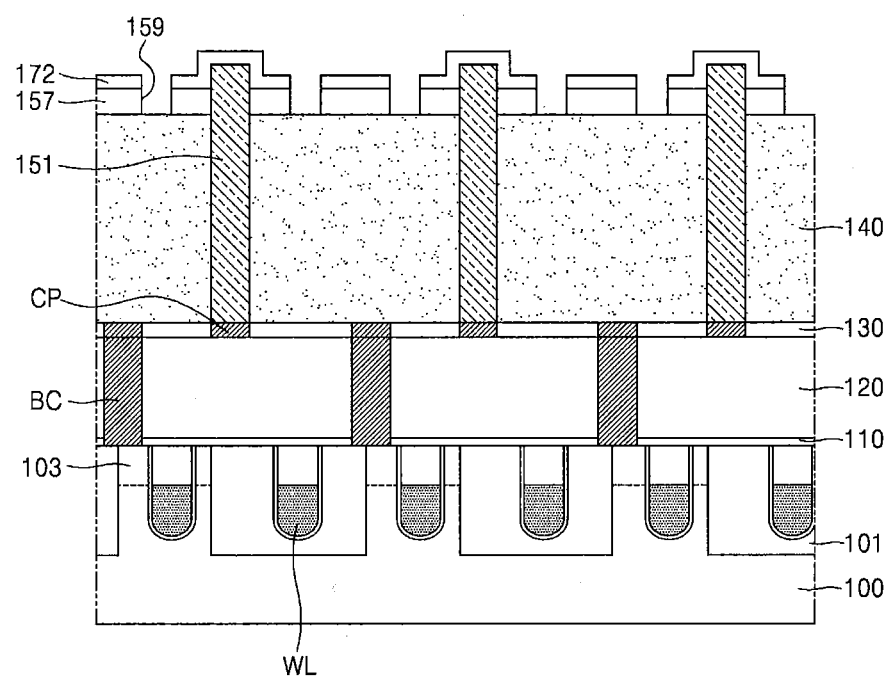

Referring to FIG. 3M, a supporting layer 157 may be obtained by etching the modified supporting material layer pattern 157c (see FIG. 3L) with the inorganic mask 172 as an etch mask. The modified supporting material layer pattern 157c may be patterned by an anisotropic etching process.

The through-hole 159 may be formed at a position when a portion of the modified supporting material layer pattern 157c is removed by the anisotropic etching process, and the mold layer 140 may be exposed by the through-hole 159.

In a case where the through-hole 159 is formed by a photolithography process, a diameter and a pitch of the through-hole 159 may be limited by a resolution. However, in some example embodiments, the photolithography process may not be used for forming the through-hole 159. That is, a micro-pattern for realizing a high resolution may be relatively simply formed even without using expensive photolithography equipment.

Moreover, unlike conventional double patterning technology (DPT) or quadruple patterning technology (QPT), a micro-pattern is obtained through a relatively simple process without undergoing a complicated and inconvenient process.

Figure 3N:
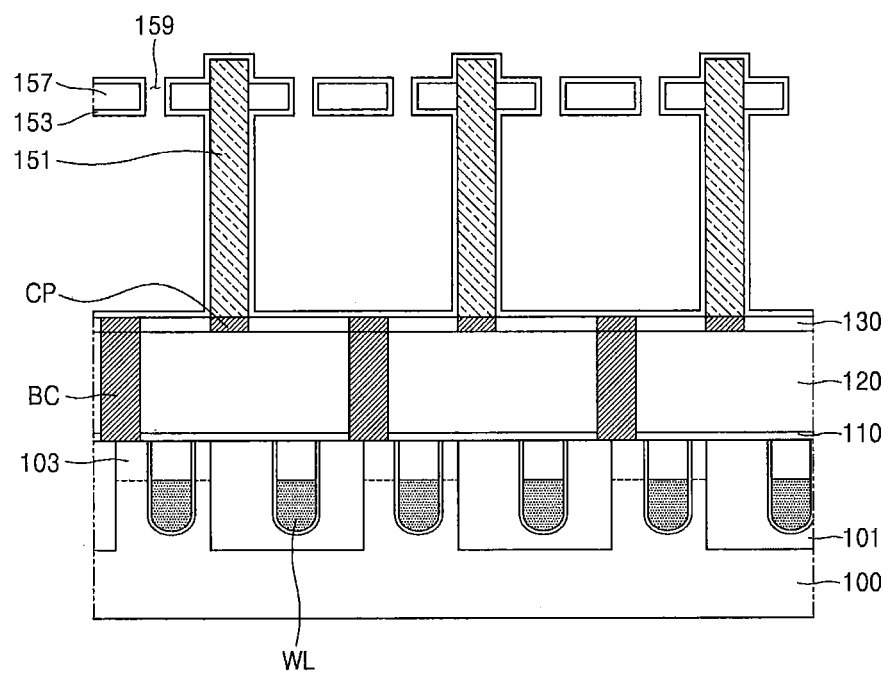
Figure 30:
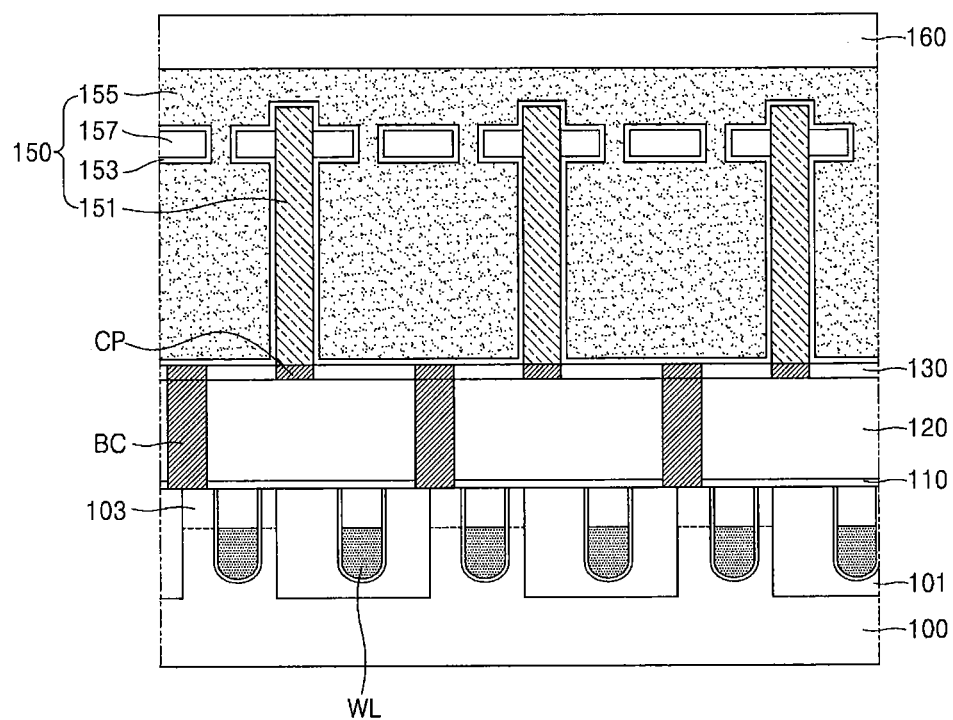

Referring to FIG. 3N, the mold layer 140 may be removed through the through-hole 159. The mold layer 140 may be removed by a lift-off process using an etchant (e.g., HF).

After the mold layer 140 is removed, the bottom electrode 151 may be supported by the supporting layer 157. When removing the mold layer 140, the inorganic mask 172 may be removed along with the mold layer 140.

A dielectric layer 153 may be conformally formed on a surface of the bottom electrode 151 which is exposed by removing the mold layer 140. At this time, the dielectric layer 153 may also be formed on an exposed surface of the supporting layer 157. The dielectric layer 153 may not be formed in a portion, of a surface of the bottom electrode 151 that contacts the supporting layer 157.

The dielectric layer 153 may include nitride, oxide, metal oxide, or a combination thereof. For example, the dielectric layer 153 may include silicon nitride, silicon oxide, metal oxide (e.g., $HfO_2$, $ZrO_2$, $Al_2O_3$, $La_2O_3$, $Ta_2O_3$, or $TiO_2$), or a dielectric material having a perovskite structure (e.g., STO ($SrTiO_3$), BST (($Ba,Sr)TiO_3$), $BaTiO_3$, PZT, or PLZT). The dielectric layer 153 may include a single layer, or a multi-layer structure. A detailed example of the multi-layer structure may include, for example, a structure of zirconium oxide/aluminium oxide/zirconium oxide (ZAZ) or zirconium oxide/aluminium oxide/tantalum oxide (ZAT).

In some example embodiments, the dielectric layer 153 may have a thickness of about 50 nm to about 150 nm, but example embodiments are not limited thereto. The dielectric layer 153 may be formed by, for example, a CVD process, a PVD process, or an ALD process.

Referring to FIG. 3O, a top electrode 155 may be formed. The top electrode 155 may be formed on the dielectric layer 153. The top electrode 155 may include cobalt (Co), titanium (Ti), nickel (Ni), tungsten (W), molybdenum (Mo), platinum (Pt), ruthenium (Ru), iridium (Jr), titanium nitride (TiN), tantalum nitride (TaN), titanium aluminium nitride (TiAlN), tantalum aluminium nitride (TaAlN), titanium silicon nitride (TiSiN), tungsten nitride (WN), platinum oxide (PtO), ruthenium oxide (RuOx), iridium oxide (IrOx), SRO ($SrRuO_3$), BSRO(($Ba,Sr)RuO_3$), CRO($CaRuO_3$), LSCO (($La,Sr)CoO_3$), or a combination thereof. However, materials of the top electrode 155 are not limited to the above-described materials.

The top electrode 155 may be formed by, for example, a CVD process, an MOCVD process, a PVD process, or an ALD process.

A capacitor 150 may be configured by the bottom electrode 151, the dielectric layer 153, and the top electrode 155.

Moreover, the bottom electrode 151 may be supported by the supporting layer 157 as illustrated in FIGS. 3N and 4, and thus, even when the bottom electrode 151 has a high aspect ratio, the bottom electrode 151 stands without falling down.

Depending on the case, a fourth interlayer insulation layer 160 may be further formed on the top electrode 155. The fourth interlayer insulation layer 160 may include HDP oxide, TEOS, PE-TEOS, O3-TEOS, USG, PSG, BSG, BPSG, FSG, SOG, TOSZ, or a combination thereof. In some example embodiments, the fourth interlayer insulation layer 160 may include silicon nitride, silicon oxynitride, or a low-k material having a low dielectric constant.

Figure 5A:
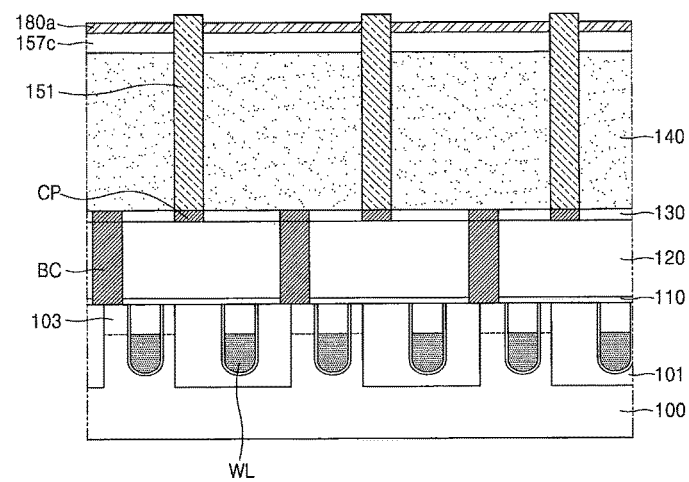
FIGS. 5A to 5C are side cross-sectional views sequentially illustrating a method of manufacturing a semiconductor device, according to another example embodiment of the inventive concepts.
Figure 5B:
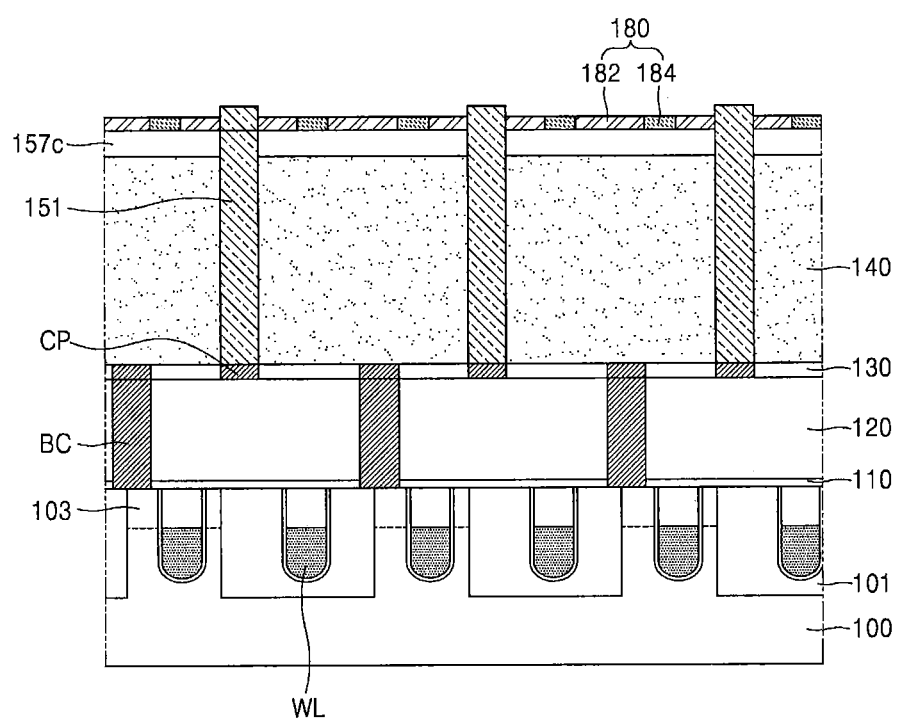
Figure 5C:
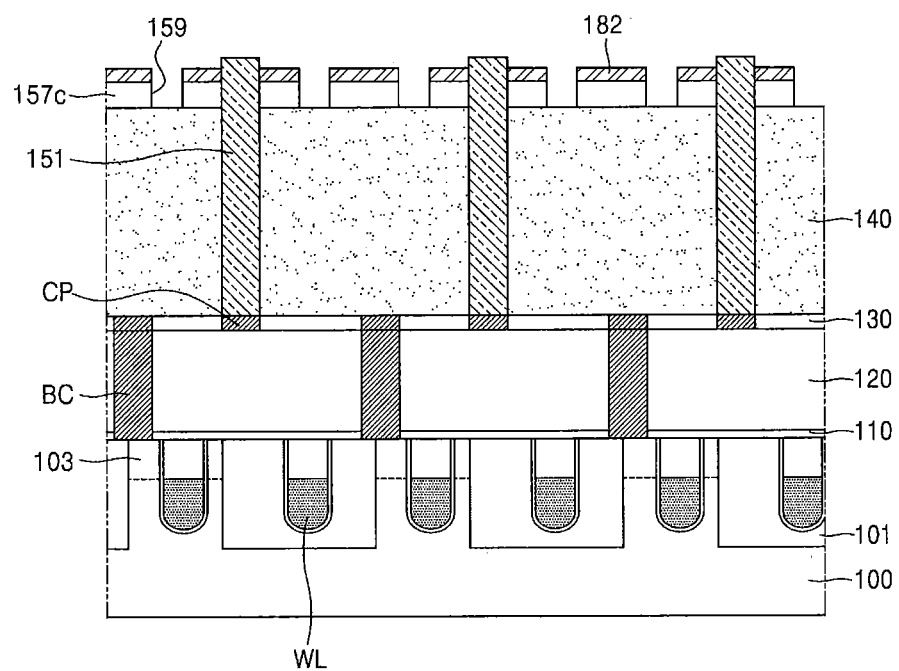
Figure 6:
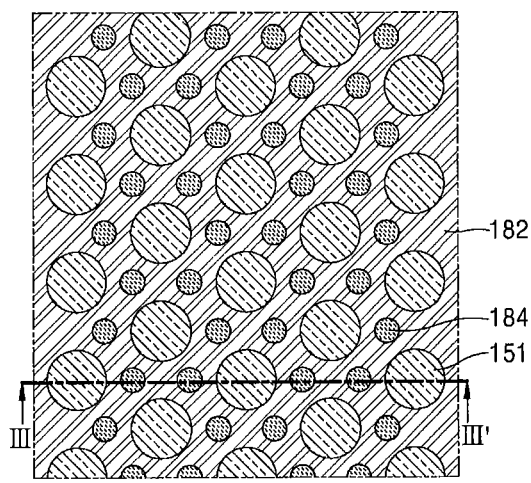
FIG. 6 is a plan view illustrating a layout in a process of FIG. 5B.

FIGS. 5A to 5C are side cross-sectional views sequentially illustrating a method of manufacturing a semiconductor device, according to another example embodiment. FIG. 6 is a plan view illustrating a layout in a process of FIG. 5B. In comparison with the example embodiment described above with reference to FIGS. 3A to 3O, the method of manufacturing a semiconductor device according to the present example embodiment has a difference in that the inorganic mask material layer 172a and the inorganic mask 172 are not formed. The method of manufacturing a semiconductor device according to the present example embodiment may include the processes of FIGS. 3A to 3F, and thus, descriptions on the processes are omitted.

Subsequently to the process of FIG. 3F, referring to FIG. 5A, a block copolymer layer 180a may be formed on the modified supporting material layer pattern 157c.

The block copolymer is as described above with reference to FIG. 3H, and thus, its detailed description is omitted. Likewise, the block copolymer layer 180a may be formed by, for example, a spin coating process.

Referring to FIGS. 5B and 6, the block copolymer layer 180 may be phase-separated through, for example, an annealing process. A phase separation condition is as described above with reference to FIG. 3I.

Unlike FIG. 3I, a portion of the block copolymer layer 180a may contact the bottom electrode 151, and the other portion of the block copolymer layer 180a may contact the modified supporting material layer pattern 157c. Because a surface characteristic of the bottom electrode 151 differs from that of the modified supporting material layer pattern 157c, a condition where a first polymer block and a second polymer block included in a block copolymer interact with adjacent layers contacting the first and second polymer blocks may be different from the condition in FIG. 3I. A portion which contacts the bottom electrode 151 through phase separation may be the first polymer block, and thus, a material of the bottom electrode 151 and/or the first polymer block may be selected based on affinity with the bottom electrode 151.

Shapes and disposition of the first block part 182 and the second block part 184 have been described above with reference to FIG. 3I, and thus, their additional descriptions are omitted.

Referring to FIG. 5C, the second block part 184 may be removed, and the modified supporting material layer pattern 157c may be patterned by using the first block part 182 as an etch mask. The modified supporting material layer pattern 157c may be patterned by, for example, an anisotropic etching process.

A process of removing the second block part 184 has been described above with reference to FIG. 3J, and thus, its detailed description is omitted. A process of patterning the modified supporting material layer pattern 157c has been described above with reference to FIG. 3M, and thus, its detailed description is omitted.

Subsequently, the first block part 182 and the mold layer 140 may be removed. The first block part 182 and the mold layer 140 may be removed simultaneously, or may be removed by separate processes. A process of removing the first block part 182 has been described above with reference to FIG. 3L, and a process of removing the mold layer 140 has been described above with reference to FIG. 3N. Therefore, detailed descriptions are omitted, and processes subsequent thereto are as described above with reference to FIGS. 3N and 3O.

In the example embodiment of FIGS. 5A to 5C, because the inorganic mask material layer 172a and the inorganic mask 172 are not formed, a process may be more simply performed at a relatively low cost.

FIGS. 7A to 7H are side cross-sectional views sequentially illustrating a method of manufacturing a semiconductor device, according to still another example embodiment. In comparison with the example embodiment described above with reference to FIGS. 3A to 3O, the method of manufacturing a semiconductor device according to the present example embodiment has a difference in that a bottom electrode uses a bottom electrode having a cylinder type with an upper end opened, instead of a pillar type. The method of manufacturing a semiconductor device according to the present example embodiment may include the processes of FIGS. 3A to 3D, and thus, descriptions on the processes are omitted.

Figure 7A:
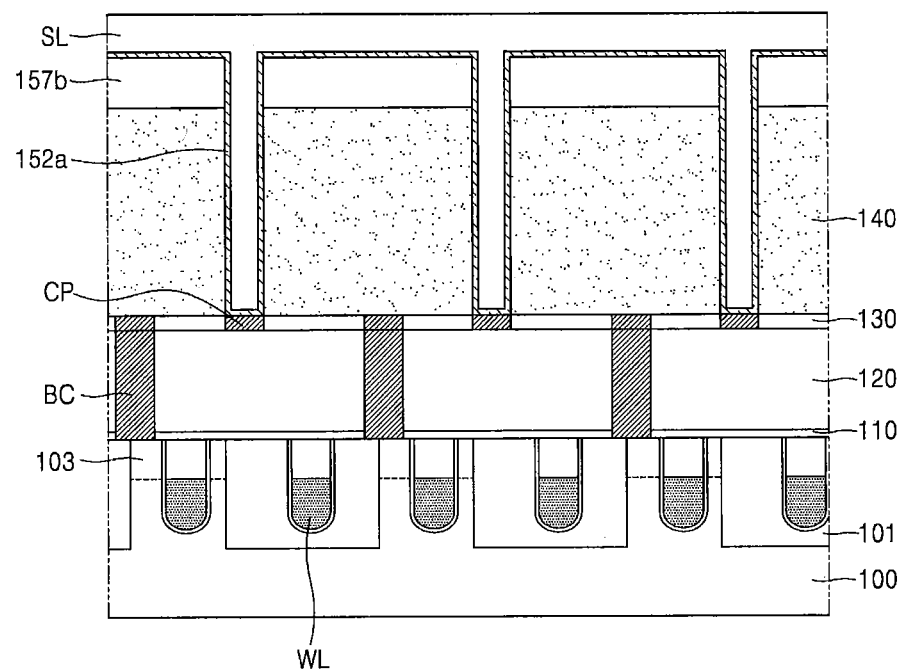
FIGS. 7A to 7H are side cross-sectional views sequentially illustrating a method of manufacturing a semiconductor device, according to still another example embodiment of the inventive concepts.

Subsequent to the process illustrated in FIG. 3D, referring to FIG. 7A, a bottom electrode material layer 152a may be formed on an internal surface of the recess pattern RS and an upper surface of the supporting material layer pattern 157b. That is, the bottom electrode material layer 152a may be conformally formed on a side wall and a floor of the recess pattern RS. Also, the bottom electrode material layer 152a may extend to the upper surface of the supporting material layer pattern 157b and may be formed to cover the upper surface of the supporting material layer pattern 157b.

A material of the bottom electrode material layer 152a may be the same as that of the bottom electrode 151 described above with reference to FIG. 3E. The bottom electrode material layer 152a may be formed by, for example, a CVD process, an MOCVD process, a PVD process, or an ALD process. Also, the bottom electrode material layer 152a may have a thickness of about 10 nm to about 100 nm.

Subsequently, a sacrificial layer SL may be formed to bury an internal space of the recess pattern RS. The sacrificial layer SL may include a material which is the same as that of the mold layer 140.

The sacrificial layer SL may be formed by, for example, a CVD process, an MOCVD process, a PVD process, or an ALD process, but example embodiments are not limited thereto.

Figure 7B:
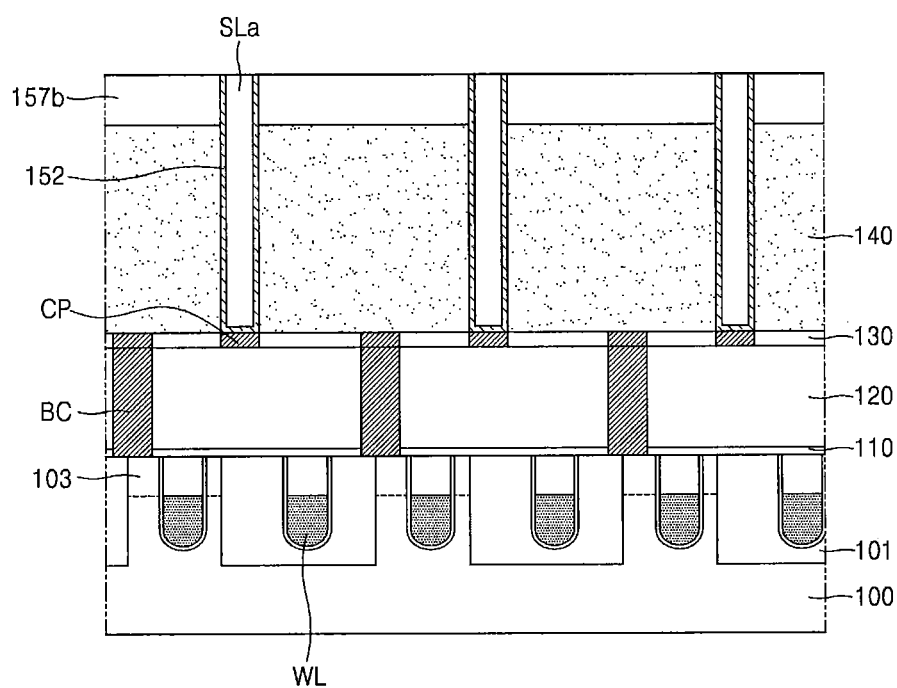

Referring to FIG. 7B, node separation may be performed by partially removing the bottom electrode material layer 152a. The bottom electrode material layer 152a and the sacrificial layer SL disposed on the upper surface of the supporting material layer pattern 157b may be removed. The bottom electrode material layer 152a and the sacrificial layer SL may be removed by a CMP and/or etchback process.

The bottom electrode 152 may be obtained through the node separation, and the inside of the bottom electrode 152 may be filled with a sacrificial material layer SLa. In FIG. 7B, an upper surface of the sacrificial material layer pattern SLa is illustrated as being disposed on the same plane as a top end of the bottom electrode 152, but the upper surface of the sacrificial material layer pattern SLa may be disposed more downward than the top end of the bottom electrode 152, namely, may be disposed within the bottom electrode 152.

Figure 7C:
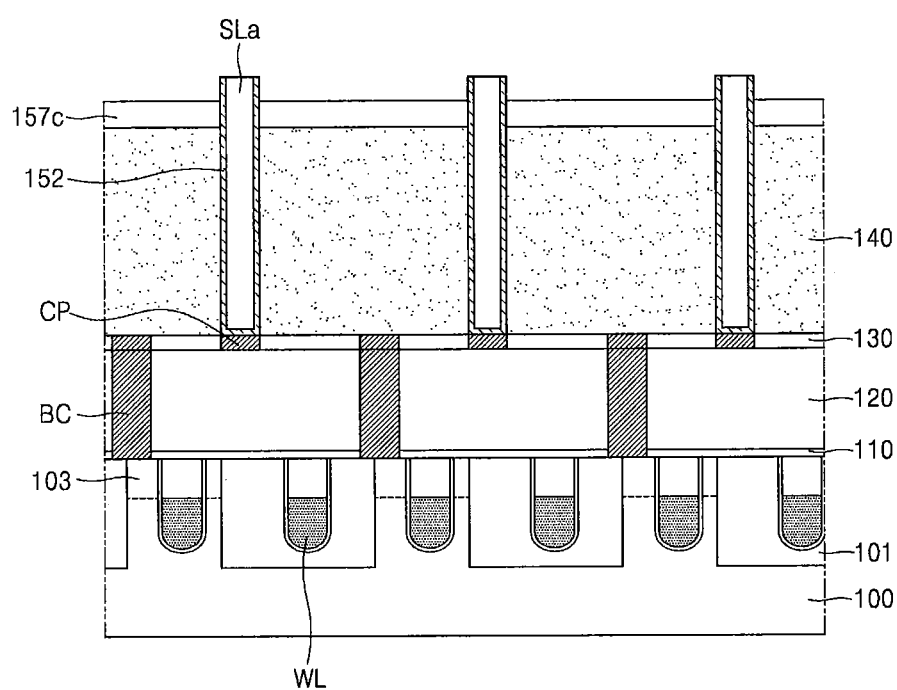

Referring to FIG. 7C, the bottom electrode 152 may be provided in plurality, and a portion of an upper portion of the modified supporting material layer pattern 157c may be removed in order to an upper portion of each of the bottom electrodes 152 to protrude.

A method of partially removing the upper portion of the supporting material layer pattern 157b (see FIG. 7B) has been described above with reference to FIG. 3F, and thus, its additional description is omitted.

Here, this example embodiment illustrates a case where a subsequent process is performed without removing the sacrificial material layer SLa burying the insides of the bottom electrodes 152. However, in some example embodiments, the subsequent process may be performed after the sacrificial material layer pattern SLa is removed.

Figure 7D:
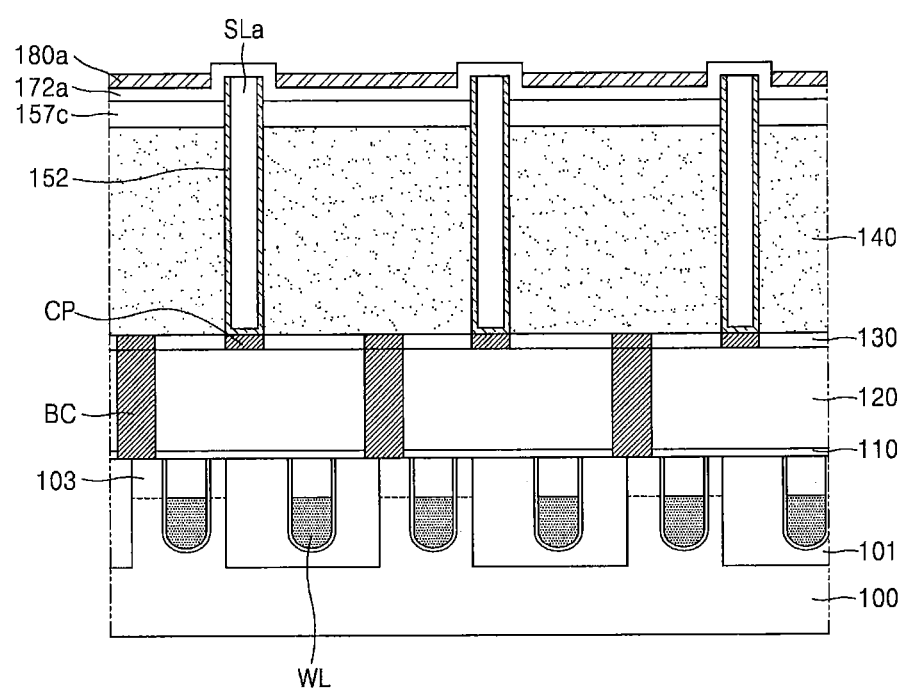

Referring to FIG. 7D, an inorganic mask material layer 172a may be conformally formed to cover a surface of an exposed portion of the bottom electrode 152, the upper surface of the modified supporting material layer pattern 157c, and the upper surface of the sacrificial material layer pattern SLa.

A material of the inorganic mask material layer 172a and a method of forming the inorganic mask material layer 172a have been described above with reference to FIG. 3G, and thus, their detailed descriptions are omitted.

Because the inorganic mask material layer 172a is conformally formed along each of the surfaces, the inorganic mask material layer 172a may include a floor, extending along the upper surface of the modified supporting material layer pattern 157c, and a side wall which vertically extends along the surface of the exposed portion of the bottom electrode 152. Also, the inorganic mask material layer 172a may include a top portion which covers the upper surface of the bottom electrode 152 and the upper surface of the sacrificial material layer pattern SLa.

A height difference between the floor and the top portion may be about 10 nm to about 300 nm.

As described above with reference to FIG. 7C, if the sacrificial material layer pattern SLa has been removed, a deposition condition may be selected so that the inorganic mask material layer 172a can conformally cover (instead of burying) an internal space of an opened cylinder defined by the bottom electrode 152. In this case, therefore, when the inorganic mask material layer 172a is formed, the internal space of the bottom electrode 152 may be empty.

Subsequently, a block copolymer layer 180a may be formed on the inorganic mask material layer 172a. A material of the block copolymer layer 180a and a method of forming the block copolymer layer 180a have been described above with reference to FIG. 3H, and thus, their additional descriptions are omitted.

In FIG. 7D, it is illustrated that a thickness of the block copolymer layer 180a may be chosen to be less than a height difference between the floor and the top portion of the inorganic mask material layer 172a, but example embodiments are not limited thereto. In other example embodiments, the thickness of the block copolymer layer 180a may be greater than the height difference between the floor and the top portion of the inorganic mask material layer 172a.

Figure 7E:
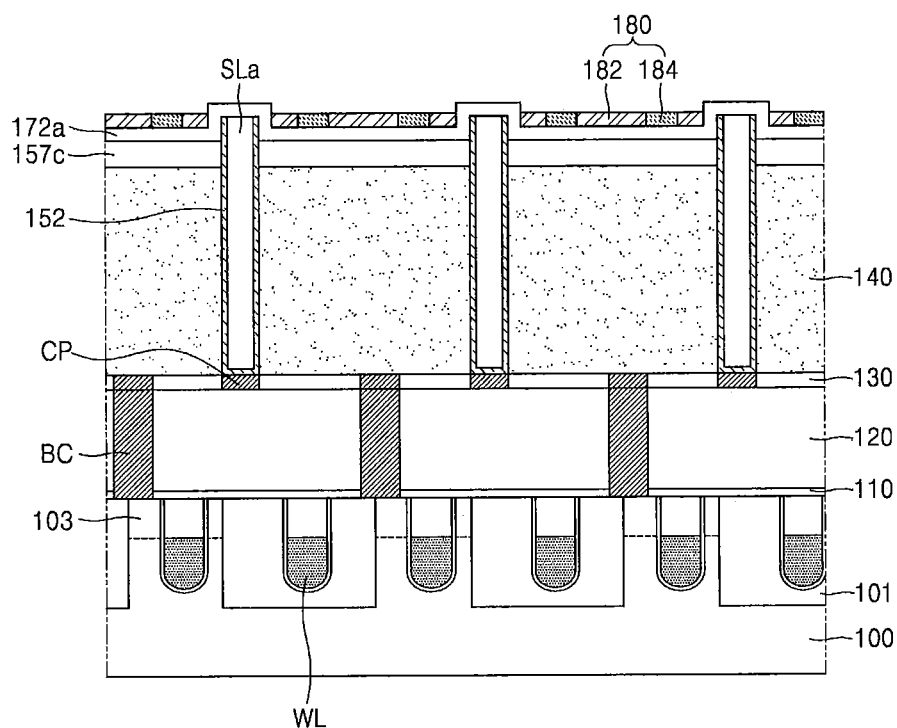

Referring to FIG. 7E, a first block part 182 including the first polymer block and a second block part 184 including the second polymer block may be obtained by performing micro-phase separation on the block copolymer layer 180a. A phase separation condition is as described above with reference to FIG. 3I. Also, shapes and disposition of the first block part 182 and the second block part 184 have been described above with reference to FIG. 3I, and thus, their additional descriptions are omitted.

Figure 7F:
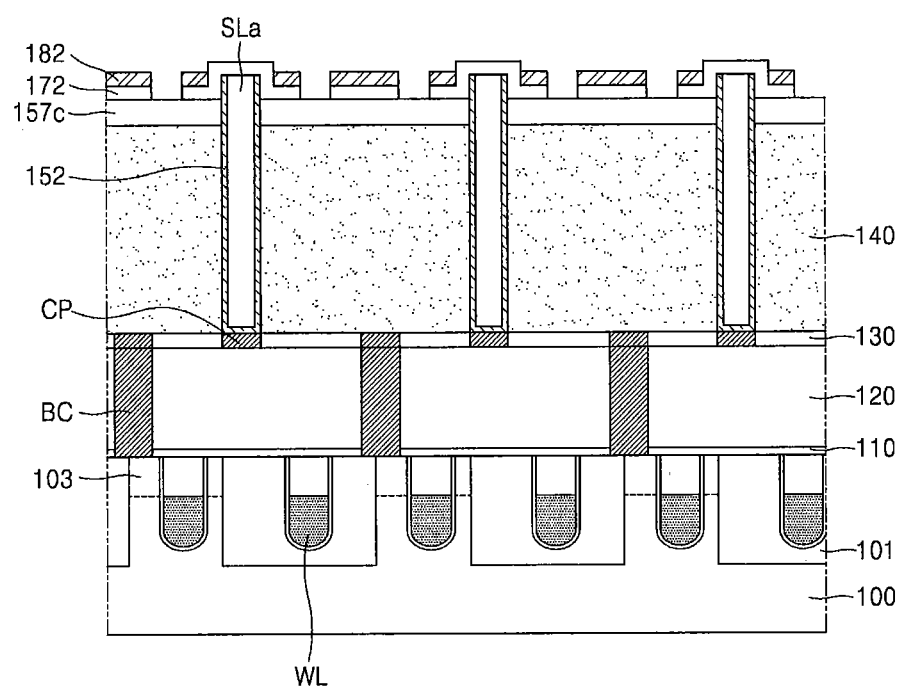

Referring to FIG. 7F, the second block part 184 may be removed, and the inorganic mask material layer 172a may be patterned by using the first block part 182 as an etch mask, thereby obtaining an inorganic mask 172.

A process of removing the second block part 184 has been described above with reference to FIG. 3J, and thus, its detailed description is omitted. A process of patterning the inorganic mask material layer 172a by using the first block part 182 as the etch mask has been described above with reference to FIG. 3M, and thus, its detailed description is omitted.

Subsequently, although not shown in FIG. 7F, the first block part 182 used as the etch mask may be removed after the inorganic mask material layer 172a is patterned. A process of removing the first block part 182 has been described above with reference to FIG. 3L, and thus, its additional description is omitted.

Figure 7G:
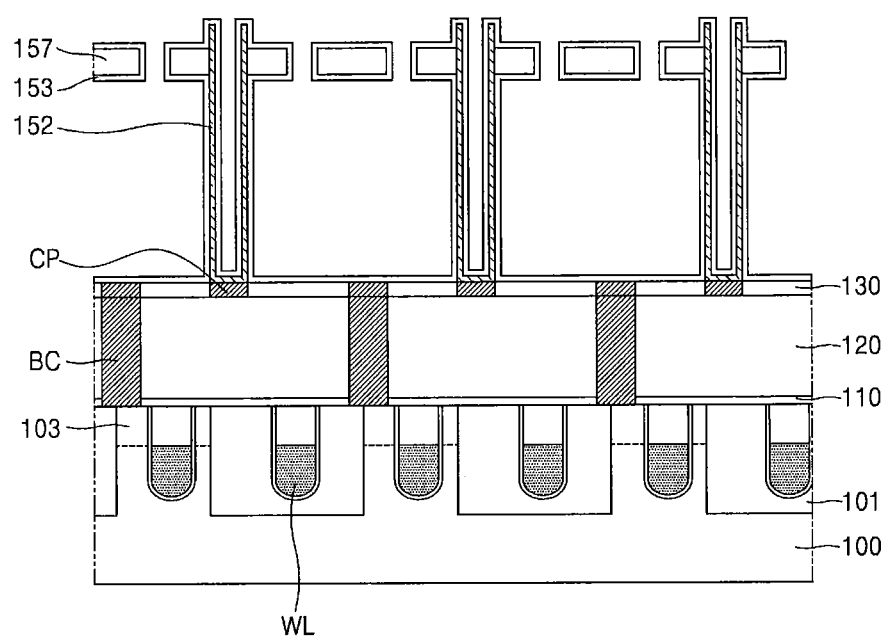

Referring to FIG. 7G, a supporting layer 157 including a through-hole 159 may be obtained by etching a modified supporting material layer pattern 157c (see FIG. 7F) with the inorganic mask 172 as an etch mask. A process of etching the modified supporting material layer pattern 157c (see FIG. 7F) has been described above with reference to FIG. 3M, and thus, its detailed description is omitted.

Subsequently, the mold layer 140 may be removed through the through-hole 159. The mold layer 140 may be removed by a lift-off process using, for example, LAL or HF. After the mold layer 140 is removed, the bottom electrode 152 may be supported by the supporting layer 157. When removing the mold layer 140, the inorganic mask 172 may be removed along with the mold layer 140. In some example embodiments, the inorganic mask 172 and the mold layer 140 may be removed by separate processes.

Further, the sacrificial material layer pattern SLa existing inside the bottom electrode 152 may be removed by the lift-off process along with the mold layer 140. In some example embodiments, the sacrificial material layer pattern SLa existing inside the bottom electrode 152 may be removed by a separate process different from the lift-off process.

Subsequently, a dielectric layer 153 may be conformally formed on a surface of the bottom electrode 151 which is exposed by removing the mold layer 140. At this time, the dielectric layer 153 may also be formed on an exposed surface of the supporting layer 157. The dielectric layer 153 may be conformally formed on an internal surface of the bottom electrode 152 having a cylinder type.

A material and thickness of the dielectric layer 153 and a method of forming the dielectric layer 153 have been described above with reference to FIG. 3N, and thus, their additional descriptions are omitted.

Figure 7H:
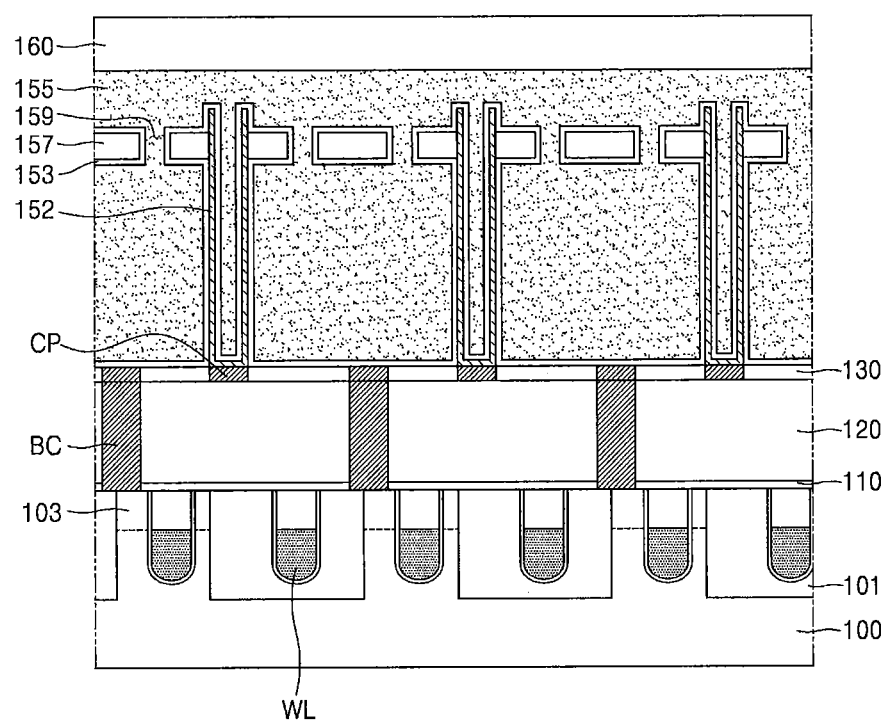

Referring to FIG. 7H, a top electrode 155 may be formed. The top electrode 155 may be formed on the dielectric layer 153. A material and thickness of the top electrode 155 and a method of forming the top electrode 155 have been described above with reference to FIG. 3O, and thus, their additional descriptions are omitted.

A capacitor 150 may be configured by the bottom electrode 151, the dielectric layer 153, and the top electrode 155.

Depending on the case, a fourth interlayer insulation layer 160 may be further formed on the top electrode 155.

According to this example embodiment, by using the micro-pattern forming method, a precise micro-pattern may be obtained through a relatively simple process at a relatively low cost. Also, by applying the micro-pattern to a capacitor manufacturing method, a capacitor having a high aspect ratio may be uniformly manufactured.

Figure 8:
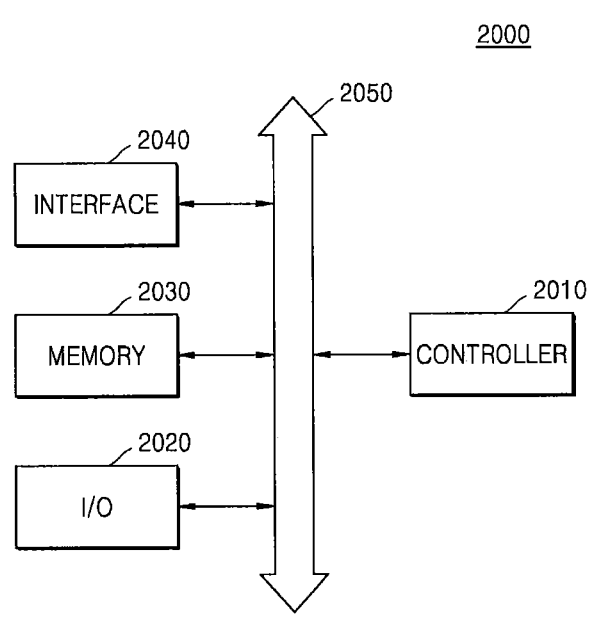
FIG. 8 is a block diagram of an electronic system according to an example embodiment of the inventive concepts.

FIG. 8 is a block diagram of an electronic system 2000 according to an example embodiment.

Referring to FIG. 8, the electronic system 2000 may include a controller 2010, an input/output (I/O) unit 2020, a memory 2030, and an interface 2040. The elements may be connected to each other through a bus 2050.

The controller 2010 may include at least one of a microprocessor, a digital signal processor, and a processing device similar thereto. The I/O unit 2020 may include at least one of a keypad, a keyboard, and a display. The memory 2030 may store a command executed by the controller 2010. For example, the memory 2030 may store user data.

The electronic system 2000 may configure a wireless communication device or a device which transmits and/or receives information in a wireless environment. In the electronic system 2000, the interface 2040 may be configured as a wireless interface, for transmitting/receiving data over a wireless communication network. The interface 2040 may include an antenna and/or a wireless transceiver. In some example embodiments, the electronic system 200 may be applied to a $3^{rd}$ generation communication system, for example, a communication interface protocol of a $3^{rd}$ generation communication system such as code division multiple access (CDMA), global system for mobile communications (GSM), north American digital cellular (NADC), extended-time division multiple access (E-TDMA), and/or wide band code division multiple access (WCDMA). The electronic system 200, particularly, at least one of the controller 2010 and the memory 2030, may include at least one of the above-described semiconductor devices according to example embodiments of the inventive concepts and semiconductor devices manufactured by modifying and changing the semiconductor devices within the technical spirit of the inventive concepts.

While the inventive concepts have been particularly shown and described with reference to some example embodiments thereof, it will be understood that various changes in form and details may be made therein without departing from the spirit and scope of the following claims.

What is claimed is:

1. A semiconductor device comprising:
   a substrate;
   a plurality of bottom electrodes passing through a supporting layer on the substrate;
   a dielectric layer-on each of the plurality of bottom electrodes;
   a top electrode on the dielectric layer,
   wherein the plurality of bottom electrodes are respectively at positions of vertexes of a triangle, and
   the supporting layer includes a through-hole at a position corresponding to a centroid of the triangle.

2. The semiconductor device of claim 1, wherein the plurality of bottom electrodes do not contact the through-hole.

3. The semiconductor device of claim 1, wherein each of the plurality of bottom electrodes has an aspect ratio of 10 to 40.

4. The semiconductor device of claim 1, wherein a distance between a center of the through-hole and a center of one of the plurality of bottom electrodes is 10 nm to 50 nm.

5. The semiconductor device of claim 1, wherein a distance between two closest ones of the plurality of bottom electrodes is 12 nm to 32 nm.

6. The semiconductor device of claim 1, wherein the through-hole is between two closest ones of the plurality of bottom electrodes.

7. The semiconductor device of claim 1, wherein a horizontal cross-section of the through-hole has a substantially circular shape or a substantially elliptical shape.

8. The semiconductor device of claim 1, wherein a distance between a lower surface of the supporting layer and a lower end of a corresponding one of the plurality of bottom electrodes is 20% to 99% of a total height of the corresponding one of the plurality of bottom electrodes.

9. The semiconductor device of claim 1, wherein upper portions of the plurality of bottom electrodes protrudes above an upper surface of the supporting layer.

10. The semiconductor device of claim 1, wherein the plurality of bottom electrodes area pillar type or a cylinder type with an upper end opened.

11. The semiconductor device of claim 1, wherein a capacitor is comprised of the top electrode, the dielectric layer and one of the plurality of bottom electrodes.

12. A semiconductor device comprising:
a plurality of transistors on a semiconductor substrate, each of the plurality of transistors including a gate structure and an impurity region;
a first interlayer insulation layer on the transistor;
a plurality of contact plugs, each of the plurality of contact plugs penetrating the first interlayer insulation layer and electrically connected to corresponding impurity region;
a plurality of bottom electrodes passing through a supporting layer on the first interlayer insulation layer, each of the plurality of bottom electrodes electrically connected to corresponding contact plug;
a dielectric layer-on each of the plurality of bottom electrodes; and
a top electrode on the dielectric layer,
wherein the supporting layer includes a through-hole at a position corresponding to a centroid of a triangle formed by three closest bottom electrodes.

13. The semiconductor device of claim 12, wherein the triangle is an equilateral triangle.

14. The semiconductor device of claim 13, wherein the plurality of bottom electrodes are arranged at vertexes of continuous equilateral triangles.

15. The semiconductor device of claim 12, wherein each of the plurality of bottom electrodes has an aspect ratio of 10 to 40.

16. The semiconductor device of claim 12, wherein the plurality of bottom electrodes do not contact the through-hole.

17. The semiconductor device of claim 12, wherein upper portions of the plurality of bottom electrodes protrudes above an upper surface of the supporting layer.

18. The semiconductor device of claim 12, wherein six closest ones of the through-holes are respectively disposed in vertexes of a regular hexagon.

19. The semiconductor device of claim 12, wherein the plurality of bottom electrodes are a pillar type or a cylinder type with an upper end opened.

20. An electronic system comprising:
a controller;
an input/output unit configured to input or output data;
a memory configured to store data;
an interface configured to transmit data to an external device; and
a bus configured to connect the controller, the input/output unit, the memory, and the interface to communicate with each other,
wherein at least one of the controller and the memory comprises the semiconductor device of claim 12.

* * * * *

UNITED STATES PATENT AND TRADEMARK OFFICE
CERTIFICATE OF CORRECTION

| | |
|---|---|
| PATENT NO. | : 10,600,789 B2 |
| APPLICATION NO. | : 16/233715 |
| DATED | : March 24, 2020 |
| INVENTOR(S) | : Soon-mok Ha et al. |

It is certified that error appears in the above-identified patent and that said Letters Patent is hereby corrected as shown below:

In the Claims

At Column 18, Claim number 1, Line number 58-59, replacing "a dielectric layer-on each of the plurality of bottom electrodes;" with -- a dielectric layer on each of the plurality of bottom electrodes; --

At Column 19, Claim number 9, Line number 22-24, replacing "upper portions of the plurality of bottom electrodes protrudes above an upper surface of the supporting layer" with -- upper portions of the plurality of bottom electrodes protrude above an upper surface of the supporting layer --

At Column 19, Claim number 10, Line number 25-27, replacing "the plurality of bottom electrodes area pillar type or a cylinder type with an upper end opened" with -- the plurality of bottom electrodes are a pillar type or a cylinder type with an upper end opened --

At Column 19, Claim number 12, Line number 35, replacing "a first interlayer insulation layer on the transistor;" with -- a first interlayer insulation layer on the transistors; --

At Column 19, Claim number 12, Line number 38-39, replacing "electrically connected to corresponding impurity region;" with -- electrically connected to a corresponding impurity region; --

At Column 20, Claim number 12, Line number 1-2, replacing "electrically connected to corresponding contact plug;" with -- electrically connected to a corresponding contact plug; --

At Column 20, Claim number 12, Line number 3-4, replacing "a dielectric layer-on each of the plurality of bottom electrodes;" with -- a dielectric layer on each of the plurality of bottom electrodes; --

Signed and Sealed this
Twenty-sixth Day of August, 2025

Coke Morgan Stewart
*Acting Director of the United States Patent and Trademark Office*

CERTIFICATE OF CORRECTION (continued) Page 2 of 2
U.S. Pat. No. 10,600,789 B2

At Column 20, Claim number 12, Line number 6-8, replacing "the supporting layer includes a through-hole at a position corresponding to a centroid of a triangle formed by three closest bottom electrodes" with -- the supporting layer includes a plurality of through-holes, each of the plurality of through-holes being located at a position corresponding to a centroid of a triangle formed by three closest bottom electrodes --

At Column 20, Claim number 16, Line number 17-19, replacing "the plurality of bottom electrodes do not contact the through-hole" with -- the plurality of bottom electrodes do not contact the through-holes --

At Column 20, Claim number 17, Line number 21-23, replacing "upper portions of the plurality of bottom electrodes protrudes above an upper surface of the supporting layer" with -- upper portions of the plurality of bottom electrodes protrude above an upper surface of the supporting layer --

At Column 20, Claim number 20, Line number 33, replacing "a memory configured to store data;" with -- a memory configured to store the data; --

At Column 20, Claim number 20, Line number 34-35, replacing "an interface configured to transmit data to an external device;" with -- an interface configured to transmit the data to an external device; --